United States Patent
Danilo Turchetta et al.

(10) Patent No.: US 11,445,129 B2
(45) Date of Patent: Sep. 13, 2022

(54) BINNING PIXELS

(71) Applicant: IMASENIC ADVANCED IMAGING, S.L., Barcelona (ES)

(72) Inventors: Renato Andrea Danilo Turchetta, Barcelona (ES); Michele Sannino, Barcelona (ES); Adrià Bofill, Barcelona (ES)

(73) Assignee: IMASENIC ADVANCED IMAGING, S.L., Barcelona (ES)

( * ) Notice: Subject to any disclaimer, the term of this patent is extended or adjusted under 35 U.S.C. 154(b) by 0 days.

(21) Appl. No.: 16/979,144

(22) PCT Filed: May 25, 2018

(86) PCT No.: PCT/EP2018/063795
§ 371 (c)(1),
(2) Date: Sep. 8, 2020

(87) PCT Pub. No.: WO2019/170262
PCT Pub. Date: Sep. 12, 2019

(65) Prior Publication Data
US 2020/0404193 A1 Dec. 24, 2020

(30) Foreign Application Priority Data

Mar. 9, 2018 (EP) .................... 18382156

(51) Int. Cl.
*G01T 1/24* (2006.01)
*H04N 5/32* (2006.01)
(Continued)

(52) U.S. Cl.
CPC .............. *H04N 5/32* (2013.01); *G01T 1/247* (2013.01); *H04N 5/3559* (2013.01); *H04N 5/378* (2013.01)

(58) Field of Classification Search
CPC ..... H04N 5/32; G01T 1/247; H01L 27/14656; H01L 27/14641
See application file for complete search history.

(56) References Cited

U.S. PATENT DOCUMENTS 7,977,642 B2   7/2011   Moody et al.
7,990,449 B2   8/2011   Fossum
(Continued)

FOREIGN PATENT DOCUMENTS

EP   1746442 B1   1/2007
EP   2863627 A1   4/2015
(Continued)

OTHER PUBLICATIONS

International Search Report and Written Opinion dated Jan. 28, 2019 for International Patent Application No. PCT/EP2018/063795, 20 pages.
(Continued)

*Primary Examiner* — Christine S. Kim
(74) *Attorney, Agent, or Firm* — Squire Patton Boggs (US) LLP

(57) ABSTRACT

A low leakage binned pixel is provided. The pixel comprises a photodiode, a bin transistor and an output amplifier circuit. The photodiode has an anode and a cathode, the anode to collect electrons generated by light or by other form of ionising radiation, e.g. electrons. The bin transistor has a first terminal coupled to the cathode of the photodiode; a second terminal, configured to be coupled to a first terminal of a voltage reset switch (VRST) transistor; and a gate, configured to be coupled to a controller to receive a bin signal. The output amplifier circuit has an input and an output, wherein the input is coupled to the cathode of the photodiode and to
(Continued)

the second terminal of the bin transistor. A multi-pixel binned circuit, an image sensor and a camera are also provided.

20 Claims, 31 Drawing Sheets

(51) Int. Cl.
*H04N 5/378* (2011.01)
*H04N 5/355* (2011.01)

(56) References Cited

U.S. PATENT DOCUMENTS

| | | | |
|---|---|---|---|
| 2004/0135063 A1* | 7/2004 | Dosluoglu | H04N 5/347 250/208.1 |
| 2006/0274176 A1 | 12/2006 | Guidash | |
| 2010/0051784 A1 | 3/2010 | Parks | |
| 2014/0319322 A1 | 10/2014 | Mandier et al. | |
| 2016/0337567 A1 | 11/2016 | Okura et al. | |
| 2017/0134675 A1 | 5/2017 | Hynecek | |
| 2021/0120168 A1* | 4/2021 | Shim | H04N 5/3745 |

FOREIGN PATENT DOCUMENTS

| | | | | |
|---|---|---|---|---|
| JP | 2018098772 A | * | 6/2018 | ....... H01L 27/14603 |
| WO | WO2014/118561 A1 | | 8/2014 | |
| WO | WO-2021021453 A1 | * | 2/2021 | ......... H04N 5/37457 |

OTHER PUBLICATIONS

Akahane, et al., "Optimum Design of Conversion Gain and Full Well Capacity in CMOS Image Sensor With Lateral Overflow Integration Capacitor", IEEE Transactions on Electron Devices; Nov. 11, 2009, vol. 56, No. 11, pp. 2429-2435.

Ballin, et al., "Monolithic Active Pixel Sensors (MAPS) in a quadruple well technology for nearly 100% fill factor and full CMOS pixels", Sensors 2008; vol. 8, No. 1, pp. 5336-5351; ISSN 1424-8220; DOI: 10.3390/S8095336.

Cevik, et al., "An Ultra-Low Power CMOS Image Sensor with On-Chip Energy Harvesting and Power Management Capability", Sensors; Mar. 6, 2015; vol. 15, No. 3, pp. 5531-5554; XP055542860; DOI: 10.3390/sl50305531.

Decker, et al., "A 256x256 CMOS Imaging Array with Wide Dynamic Range Pixels and Column-Parallel Digital Output", ISSCC98/ Session 11 / Image Sensors / Paper FA 11.5; Feb. 6, 1998, 2 pages.

Decker, et al., "A 256x256 CMOS Imaging Array with Wide Dynamic Range Pixels and Column-Parallel Digital Output", IEEE Journal of Solid-State Circuits; Dec. 1998; vol. 33, No. 12, pp. 2081-2091.

Guerrini, et al., "A high frame rate, 16 million pixels, radiation hard CMOS sensor", JINST; Mar. 9, 2011; C03003.

Kavadias, et al., "A logarithmic response CMOS image sensor with on-chip calibration," IEEE Journal of Solid-State Circuits; Aug. 2000; vol. 35, No. 8, pp. 1146-1152.

Korthout, et al., "A wafer-scale CMOS APS imager for medical X-ray applications", IISW proceedings 2009, "Korthout et al."; 4 pages.

Sedgwick, et al., "LASSENA: A 6.7 Megapixel, 3-sides Buttable Wafer-Scale CMOS Sensor using a Novel Grid-Addressing architecture", Proceedings of the International Image SensorWorkshop IISW 2013, Snowmass, USA.

Spivak, et al., "Wide-Dynamic-Range CMOS Image Sensors—Comparative Performance Analysis", IEEE Transactions on Electron Devices; Nov. 2009; vol. 56, No. 11, pp. 2446-2461.

\* cited by examiner

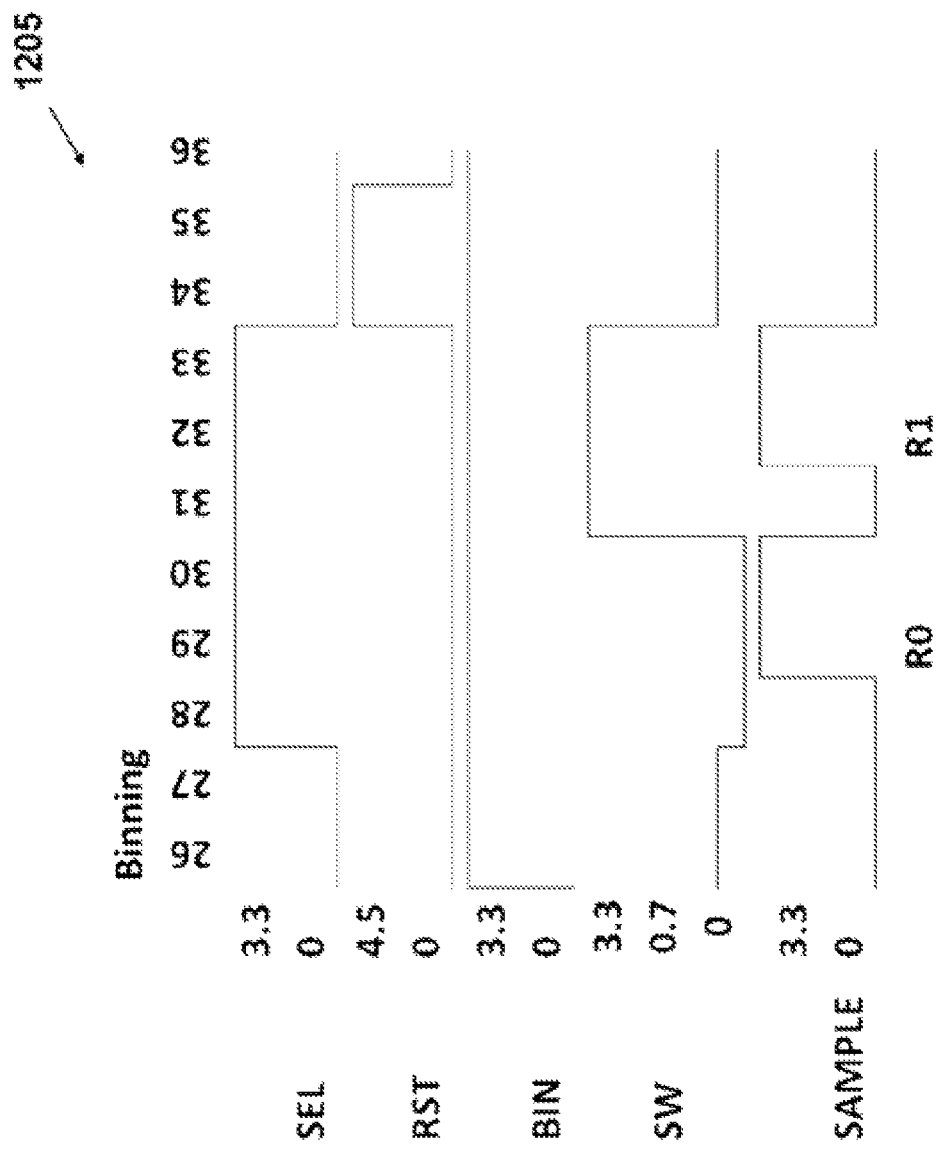

BINNING PIXELS

CROSS-REFERENCE TO RELATED APPLICATIONS

The present application is a national-stage filing under 37 USC 371(c) of International Application No. PCT/EP2018/063795, filed May 25, 2018, which claims the benefit and priority of European Patent Application No. EP18382156, filed on Mar. 9, 2018, the entire contents of each of which are herein incorporated by reference in their entirety for all purposes.

The present disclosure relates to binned pixels of CMOS image sensors, for example to binned pixels of X-ray imaging sensors.

BACKGROUND

In imaging, e.g. X-ray imaging, it is desirable to have a wide dynamic range, which can be adjusted e.g. by an external control or by an adaptive gain mechanism. In medical imaging, it may be desirable to capture images with lower resolution but faster speed, i.e. in binning mode.

It may further be desirable to be able to detect changes in the intensity of illumination, e.g. in order to detect whether the X-ray beam is still "on" or not. This mode is called "trigger" as a trigger signal can be derived by the operator to change the mode the pixel is operated. In addition, once the illumination is "on", it may be desirable to provide a way of controlling mode changes, e.g. whether it is turned off, in a mode called "monitoring".

In many applications, e.g. in X-ray digital imaging, automotive, security, smart house, etc., there is a requirement to achieve a wide dynamic range in the sensor to cope with a wide range of signals. Such dynamic range is called "intrascene" as within the same image there may be pixels with a small amount of charge as well as other pixels with a large amount of charge. Although it may sometimes be possible to collect two images with different gains (or integration times), as done e.g. with mobile phones, it may be desirable to have pixels able to cope with a wide dynamic range, i.e. a single image may suffice to capture all the details of the scene.

The time required to capture the details of a scene is divided by two and kept to a minimum. By using a single image, motion artefacts may be eliminated. Additionally, in applications such as digital X-ray imaging, the wide dynamic range operation has important implications in terms of health for the patient exposed to the beam. Indeed, capturing all the details in one single shot means less radiation sent to the patient and therefore, the danger of the radiographic examination decreases.

In X-ray imaging, the sensor may also provide a way of detecting the onset of the X-ray beam fast and accurately. To that end, a very high sensitivity is required, but the dynamic range may not be very important. It may also be desirable to have a sensor which is able to generate information that can be used to detect whether the illumination, e.g. X-ray beam, is being turned "off" or not. By doing so, the integration time can be stopped as soon as needed, thus minimising the integration of unwanted dark signals, e.g. dark current, which only introduces noise and reduces the usable dynamic range by filling the well with carriers not generated by the radiation to be detected.

In X-ray applications, it may also be desirable to be able to take lower resolution images faster. In such case, the pixel has to provide binning. Known methods provide binning on-chip but in the periphery (see Guerrini et Al.), or even off-chip by simply summing up data, however, these methods do not achieve a gain in speed which could be obtained by reading fewer pixels. Such methods may also suffer from an increased noise in the signal due to the extra activity, e.g. switching noise or kT/C noise. A pixel whose resolution can be adjusted, e.g. according to the needs of the user, may therefore be desirable.

X-ray applications benefit from the ability to monitor the rate of signal integration and the status of the beam while images are being captured. In contrast to the X-ray beam onset requirement, the monitoring of the X-ray beam would benefit from a low-gain pixel that guarantees the monitoring pixels do not saturate before the image capturing pixels. Monitoring of the status of the beam while images are being captured may be useful in X-ray imaging as it provides a way of detecting whether the beam is being turned "off" or not. If the beam is being turned off, the end of the integration period or image capture phase may be set.

Several types of wide dynamic range pixels are known: logarithmic (see Kavadias et al.), time integration, dual gain, etc. (see Spivak et al. for a review). One of the most interesting is the so-called "lateral overflow".

There may be several implementations (see Akahabe et Al., Decker et Al, Fossum, WO-561) that achieve high dynamic range but comprise a high leakage current. The additional leakage current is generated in the source/drain to bulk junction of the transistors added to the pixel. Added transistors may be in parallel with the diode, and therefore their current sums up. In cases where diodes are connected together to provide charge binning, the same effect may arise.

Binning may also be done in the voltage domain (see Guerrini et al.) but induces higher noise as the noise of the different samples sums up in quadrature. Binning in charge domain does not have this problem.

REFERENCES

N. Guerrini, R. Turchetta G. Van Hoften R. Henderson G. McMullan and A. R. Faruqi, A high frame rate, 16 million pixels, radiation hard CMOS sensor, 2011 JINST 6 C03003, herein "Guerrini et Al.".

S. Kavadias, B. Dierickx, D. Scheffer, A. Alaerts, D. Uwaerts and J. Bogaerts, "A logarithmic response CMOS image sensor with on-chip calibration," in IEEE Journal of Solid-State Circuits, vol. 35, no. 8, pp. 1146-1152, August 2000 herein "Kavadias et Al.".

Arthur Spivak, Alexander Belenky, Alexander Fish, Member, IEEE, and Orly Yadid-Pecht, Wide-Dynamic-Range CMOS Image Sensors—Comparative Performance Analysis, IEEE Trans. On Elec. Dev., VOL. 56, NO. 11, November 2009, 2446-2461, herein "Spivak et Al.".

Nana Akahane, Satoru Adachi, Koichi Mizobuchi, and Shigetoshi Sugawa, Optimum Design of Conversion Gain and Full Well Capacity in CMOS Image Sensor With Lateral Overflow Integration Capacitor, IEEE Trans. On Elec. Dev., VOL. 56, NO. 11, NOVEMBER 2009, 2429-2435, herein "Akahabe et Al.".

Steven Decker, R. Daniel McGrath, Kevin Brehmer, and Charles G. Sodini, A 256 256 CMOS Imaging Array with Wide Dynamic Range Pixels and Column-Parallel Digital Output, IEEE J. of Solid-State circuits, vol. 33, no. 12, December 1998 2081-2091, herein "Decker et Al.".

E. Fossum, High Dynamic Range Cascaded Integration Pixel Cell and method of operation, U.S. Pat. No. 7,990,449 B2, 2 Aug. 2011, herein "Fossum".

R. Turchetta, N: Guerrini, P. Gasiorek, Imaging sensors, WO2014/118561 A1, 31th Jan. 2014, herein "WO-561".

J. A. Bailin et al., Monolithic Active Pixel Sensors (MAPS) in a quadruple well technology for nearly 100% fill factor and full CMOS pixels, Sensors 2006, 7, 1, ISSN 1424-8220, herein "Bailin".

I Sedgwick, D Das, N Guerrini, B Marsh, R Turchetta, LASSENA: A 6.7 Megapixel, 3-sides Buttable Wafer-Scale CMOS Sensor using a Novel Grid-Addressing architecture, Proceedings of the International Image Sensor Workshop IISW 2013, Snowmass, USA, herein "Sedgwick".

L. Korthout, D. Verbugt, J. Timpert, A. Mierop, W. de Haan, W. Maes, J. de Meulmeester, W. Muhammad, B. Dillen, H. Stoldt, I. Peters, E. Fox. A wafer-scale CMOS APS imager for medical X-ray applications, IISW proceedings 2009, "Korthout et Al.".

R. T. Bell, EP 1 746 442 A1, herein EP-442.

Ian Moody, Martin Fryer, U.S. Pat. No. 7,977,642, herein US-642.

SUMMARY

The subject of this invention is a new type of CMOS active pixel which can provide variable, adaptive gain as well as binning in charge mode in the focal plane. This invention is also used to provide a variable gain that can be used to increase the sensitivity of the pixel when used in trigger mode and to monitor the X-ray beam signal integration.

It is noted that for the purposes of the present disclosure only field-effect transistor (FET) terminals, of e.g. MOSFET type transistors, are discussed. For a field-effect transistor (FET), the terminals are labelled gate, source, and drain, and a voltage at the gate can control a current between source and drain. However, one skilled in the art may appreciate that other types of transistors such as e.g. a bipolar junction transistor (BJT) that have terminals labelled base, collector, and emitter may also be used.

In a first aspect, a low leakage binned pixel is provided. The pixel comprises a photodiode, a bin transistor and an output amplifier circuit. The photodiode has an anode and a cathode, the anode to collect electrons generated by light or by other form of ionising radiation, e.g. electrons. The bin transistor has a first terminal coupled to the cathode of the photodiode; a second terminal, configured to be coupled to a first terminal of a voltage reset switch transistor (VRST); and a gate, configured to be coupled to a controller to receive a bin signal. The output amplifier circuit has an input and an output, wherein the input is coupled to the cathode of the photodiode and to the second terminal of the bin transistor.

In an example, the low leakage binned pixel may further comprise a lateral overflow circuit, coupled at one terminal to the cathode of the photodiode and to the first terminal of the bin transistor and at the other terminal to ground.

In an example, the lateral overflow circuit may comprise a first switch transistor and a first capacitor connected in series. The first switch transistor has a first terminal connected to the cathode of the photodiode and to the first terminal of the bin transistor, a second terminal connected to a first terminal of the first capacitor, wherein a second terminal of the first capacitor is connected to ground, and a gate configured to be coupled to a controller to receive a first switch signal.

In an example, the low leakage binned pixel may further comprise a second capacitor, having a first terminal connected to the first terminal of the first switch transistor and another terminal to ground.

In an example, the low leakage binned pixel may comprise a first switch transistor, a first capacitor, a second switch transistor and a second capacitor. The first capacitor is coupled at a first terminal to a first terminal of the first switch and at a second terminal to ground, the first switch transistor is coupled at a second terminal to the first terminal of the second capacitor, the second capacitor is coupled at a second terminal to ground and the second switch transistor is coupled at a first terminal to the cathode of the photodiode and to the first terminal of the bin transistor, and at a second terminal to the first terminal of the second capacitor. A gate of the first and second switch transistors, respectively, is configured to be coupled to a controller to receive a first and a second switch signals, respectively.

In an example, the lateral overflow circuit may further comprise an antiblooming transistor which has a first terminal coupled to a first voltage source, a second terminal coupled to the first terminal of the first capacitor, and a gate configured to be coupled to a controller to receive an antiblooming signal.

In an example, the pixel may further comprise a gain bit circuit coupled at the output of the output amplifier circuit of the low leakage binned pixels.

In CMOS image sensors, it is common to have pixels in a line to be connected to the same output line, or to a very small number of them. It is then common convention to call columns the group of pixels which are connected to the same or to a few lines and rows the pixels in the orthogonal direction. Given this convention, control signals tend to be organised row-wise as they need to control all pixels in the same row. It is also common to control each row sequentially, in a so called rolling way. In some sensors there can also be global signals, i.e. signals that can be or are applied to all the pixels in a sensor.

In an example, the output amplifier circuit comprises an input transistor and a selector transistor. The input transistor may be an input transistor of a source follower whose current source may be shared between all pixels in a column or a row of an array. The input transistor may have a first terminal coupled to a drain constant voltage source, a gate coupled to the cathode of the photodiode and to the first terminal of the bin transistor. The selector transistor may have a first terminal coupled to the source second terminal of the pixel transistor, a gate configured to be coupled to a controller, and wherein source second terminal of the selector transistor may be the output of the low leakage binned pixel.

In an example, the photodiode may be a partially pinned photodiode.

In a further aspect, a multi-pixel binned circuit is provided. The circuit comprises a plurality of low leakage HDR pixels according to any of the disclosed examples and a RST transistor. The RST transistor may have, a first terminal coupled to the second terminal of each bin transistor from the plurality the low leakage binned pixels, a second terminal coupled to a reset voltage source and a gate configured to be coupled to a controller to receive a voltage reset signal.

In an example, the multi-pixel binned circuit may comprise two low leakage binned pixels. In another example, the multi-pixel binned circuit may comprise four low leakage binned pixels.

In a further aspect, an image sensor comprising a plurality of multi-pixel binned circuits according to any of the disclosed examples is provided.

In an example, the image sensor may comprise an array of multi-pixel binned circuits.

In an example, the image sensor may further comprise a controller.

In an example, the image sensor may further comprise a gain bit circuit coupled at the output of the output amplifier circuit of the low leakage binned pixels of an array.

In an example, the controller may be configured to generate a bin signal and one or more of a voltage reset signal, a select signal, an antiblooming signal, a first switch signal and a second switch signal.

In another aspect, a camera comprising an image sensor according to any of the examples disclosed is provided.

BRIEF DESCRIPTION OF THE DRAWINGS

Non-limiting examples of the present disclosure will be described in the following, with reference to the appended drawings, in which:

FIG. 6B illustrates a timing diagram for the pixel of FIG. 5 in binning mode;

DETAILED DESCRIPTION OF EXAMPLES

The pixel circuits described herein solve the problem of increased leakage due to larger junction area when additional features are added to the basic 3T transistor to build a pixel with binning and extra functions like HDR. The solution relates to a novel arrangement of the transistors to provide functionality similar to the one currently used but with increased performance.

A "pixel" may be defined as that part of an image sensor which is able to generate an output electric voltage which depends on the intensity of light impinging on that point. The minimum unit could be simply a photodiode, although if a sensor with more than one pixels is desired, as is the case when an image is to be detected, the pixel would also include some control means which would allow generation of an output electric voltage which would be dependent on the intensity of light impinging on the sensor on a given location.

Figure 1B:
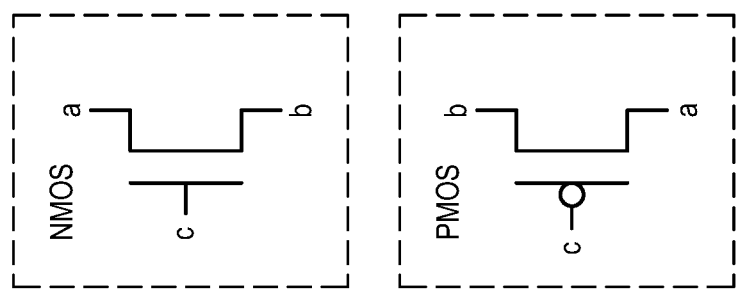
FIG. 1B schematically illustrates the terminals of a PMOS and a NMOS transistor according to an example.
Figure 1A:
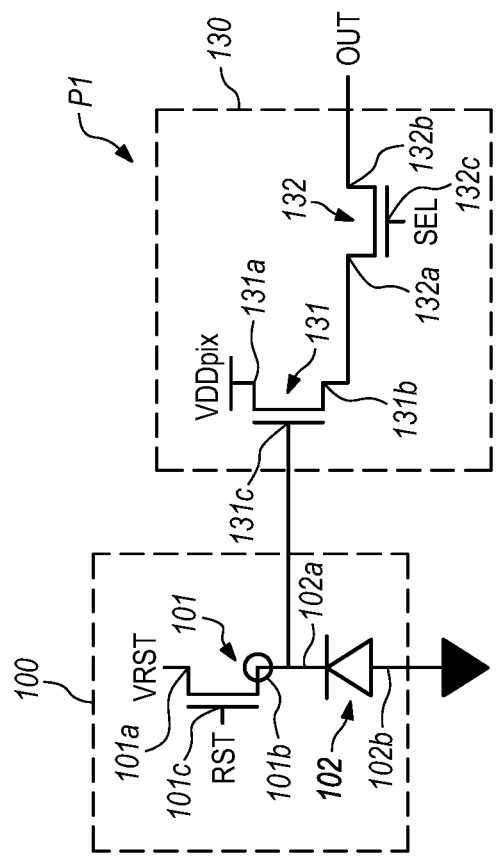
FIG. 1A schematically illustrates a pixel circuit.

FIG. 1A schematically illustrates a pixel circuit. The pixel P1 of FIG. 1A may comprise an input circuit 100 and an output circuit 130. The input circuit 100 may comprise a reset transistor 101 which may comprise three terminals 101a, 101b and 101c, and a diode 102 e.g. a Nwell to substrate, P to Nwell, N to P-substrate, partially pinned photodiode, etc., which may comprise two terminals 102a and 102b. The output circuit 130 may comprise a pixel transistor 131 which may comprise three terminals 131a, 131b and 131c; and a selector transistor 132 which may comprise three terminals 132a, 132b and 132c. Terminal 102a of diode 102 may be coupled to terminal 101b of reset transistor 101. Terminal 102b of the diode may be coupled to ground. Terminal 101c of reset transistor 101 may be connectable to a reset control signal RST. Terminal 101a of transistor 101 may be connectable to voltage source VRST. Terminal 101b may be coupled to terminal 131c of pixel transistor 131. Terminal 131a of transistor 131 may be connectable to voltage source VDDpix. Terminal 131b of transistor 131 may be coupled to terminal 132a of selector transistor 132. Terminal 132c of selector transistor 132 may be connectable to a selection control signal SEL. Terminal 132b of selector transistor 132 may be connectable to an output line OUT.

Herein, the terminals i.e. gate, source and drain, of transistors such as reset transistor 101 or pixel transistor 131 may be referenced as shown in FIG. 1B. That is, in the examples where an NMOS or a PMOS transistor is used, the transistor may have a terminal "a", a terminal "b" and a terminal "c". Terminals "a" and "b" may correspond to a drain and to a source. Terminal "c" may correspond to a gate. In NMOS transistors, a terminal "a" may function as a drain terminal and a terminal "b" as a source terminal, or vice versa, depending on the voltage difference between "a" and "b". When voltage at terminal "a" is higher than voltage in terminal "b" then terminal "a" may act as drain. Otherwise, terminal "b" may act as drain. In later Figures discussed herein, depicting different embodiments, the same trailing reference numerals "a," "b," and "c" for terminals of the transistors in those embodiments correspond to the "a," "b," and "c" terminal arrangements shown in FIG. 1B.

In an example, the diode may be a partially pinned photodiode (PPPD) which may be used for applications, e.g. X-ray digital imaging, as it allows having a large diode, with a small capacitance. As a consequence, the noise is minimized (maximising the gain) as well as keeping a low leakage current. The capacitance is kept low, hence the noise, while having a large diode, which is optimum for sensing, maximizing the fill factor and minimizing crosstalk. The sensing diode may also be, e.g. Nwell to substrate, P to Nwell, N to p-substrate, etc.

The round circle in FIG. 1A marks the junction contributing to leakage current. In a PPPD, such area may be very small, i.e. but large enough to host one contact of the line connecting the junction to the input MOS.

Figure 2:
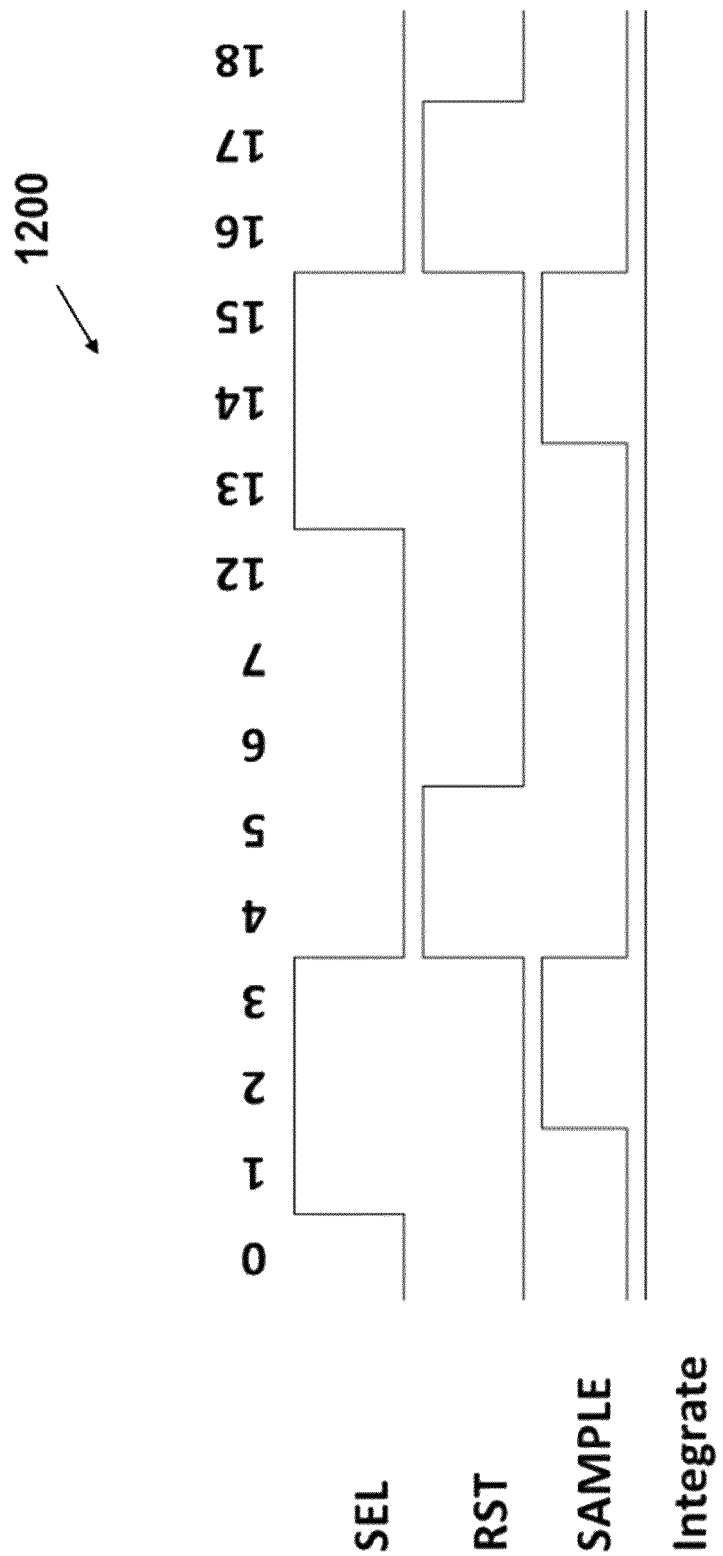
FIG. 2 illustrates a timing diagram for the pixel of FIG. 1A.

FIG. 2 shows an example of a timing diagram 1200 for the pixel circuit of FIG. 1A. The RST voltage is likely to switch at a voltage higher than the power supply. Overdriving of the RST transistor gate is therefore allowed when VRST is equal to VDDpix. The reset operation is turned more complicated, which is known to work better than having an easier reset. A complicated reset avoids image lag and unpleasant artefacts. During reset operation, the RST transistor would normally be operated outside its normal rating.

However, this should be balanced against the duty cycle of this operation. First of all, the gate-to-source would only exceed the rated voltage during the initial phase of the reset and only if the pixel is close to saturation. The change during reset operation is a small fraction of the reset time, e.g. 100 ns against 1 µsec. Such duty cycle may be reduced if the operation is performed in a "rolling" fashion, i.e. row-by-row. In that case, the duty cycle would be reduced by a fraction equal to the number of rows in the sensor, or to the number of independent rows in a sensor, if the reset is applied to several rows simultaneously.

The sample signal shown in FIG. 2 is the signal that would be applied to the periphery of the array in order to drive the sampling of the pixel output, e.g. in a sampling capacitor.

Also in FIG. 1A, the leakage current only comes from the diode junction as the RST transistor junction is integrated with it. As functionalities are added to the pixel circuit, e.g. HDR or binning, other junctions are added in parallel to this one, thus contributing to the leakage current.

Figure 3:
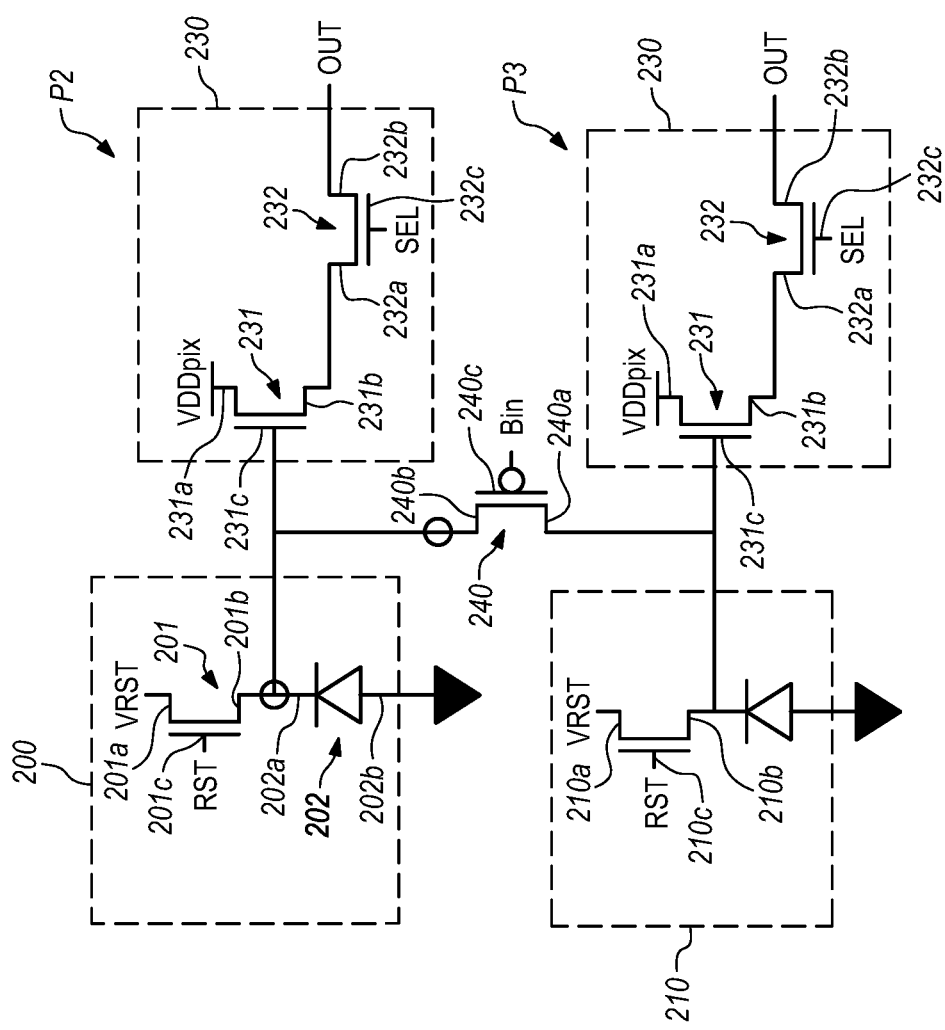
FIG. 3 schematically illustrates a binned pixel circuit.

FIG. 3 shows a case when binning is added. A further junction, marked with a circle, is now sitting next to the binning transistor. Such junction would generate additional leakage current.

FIG. 3 depicts a binned pixel circuit comprising two pixels P2 and P3 according to pixel 1 of FIG. 1A and a binning transistor 240 which may comprise three terminals 240a, 240b and 240c. Pixel 2 may comprise an input circuit 200 and an output circuit 230. The input circuit 200 may comprise a reset transistor 201 which may comprise three terminals 201a, 201b and 201c; and a diode 202 e.g. a Nwell to substrate, P to Nwell, N to P-substrate, partially pinned photodiode, etc., which may comprise two terminals 202a and 202b. The output circuit 230 may comprise a pixel transistor 231 which may comprise three terminals 231a, 231b and 231c; and a selector transistor 232 which may comprise three terminals 232a, 232b and 232c. Terminal 202a of diode 202 may be coupled to terminal 201b of transistor 201. Terminal 202b of the diode may be coupled to ground. Terminal 201c of transistor 201 may be connectable to a reset control signal. Terminal 201a of transistor 201 may be connectable to voltage source VRST. Terminal 201b may be coupled to terminal 231c of pixel transistor 231 and to terminal 240b of binning transistor 240. Terminal 231a of transistor 231 may be connectable to voltage source VDDpix. Terminal 231b of transistor 231 may be coupled to terminal 232a of selector transistor 232. Terminal 232c of selector transistor 232 may be connectable to a selection control signal. Terminal 232b of selector transistor 232 may be connectable to an output device. Terminal 240c of binning transistor 240 may be connectable to a binning control signal. Pixel P3 may comprise an input circuit 210 and an output circuit 230 similar to the ones of pixel P2. Terminal 240a of binning transistor 240 may be coupled to the output terminal of the input circuit 210 and to the input terminal of the output circuit 230 of pixel P3. The output OUT of pixel P3 may be connected to the output OUT of pixel P2.

Figure 4A:
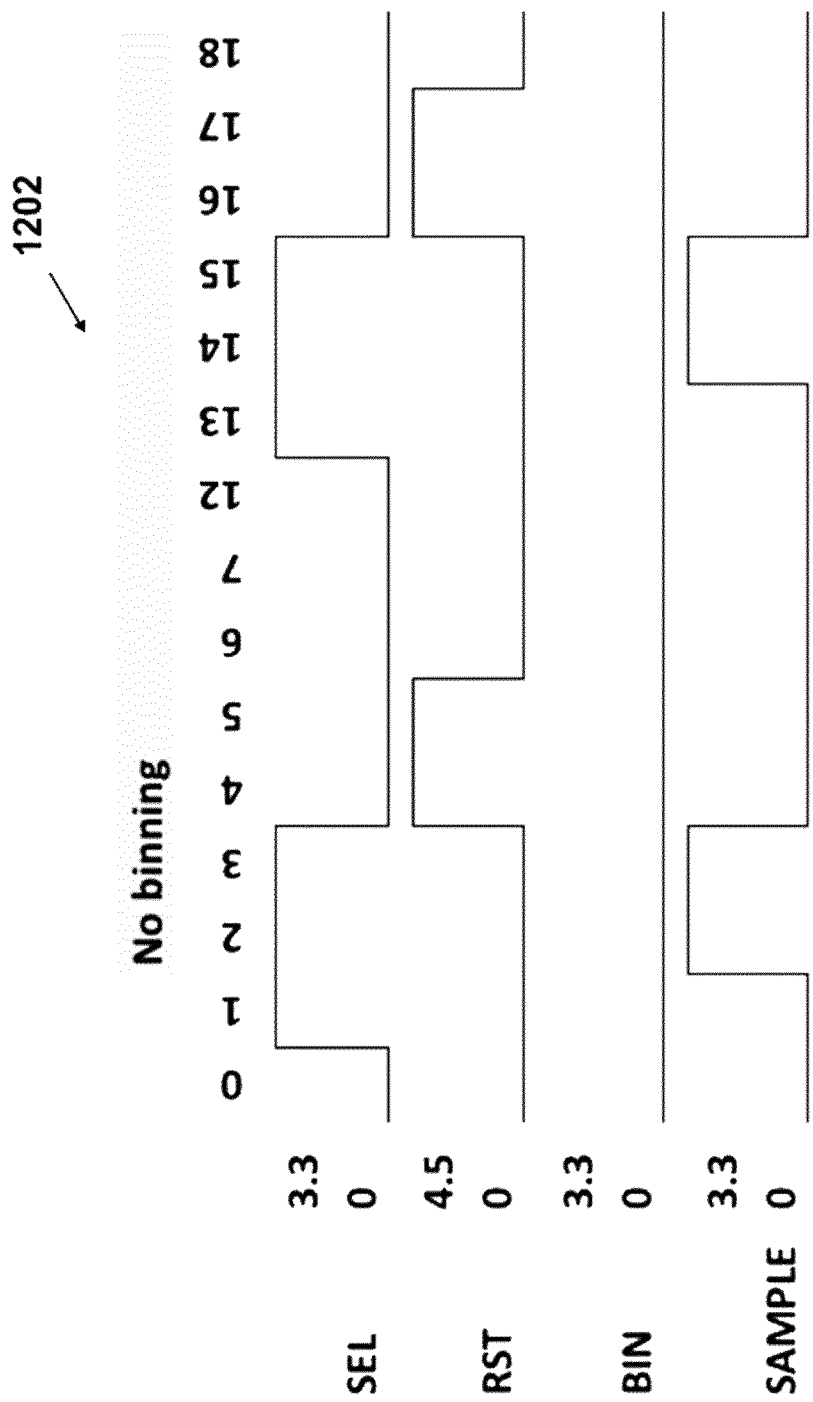
FIG. 4A illustrates a timing diagram for the pixel circuit of FIG. 3 in no binning mode.
Figure 4B:
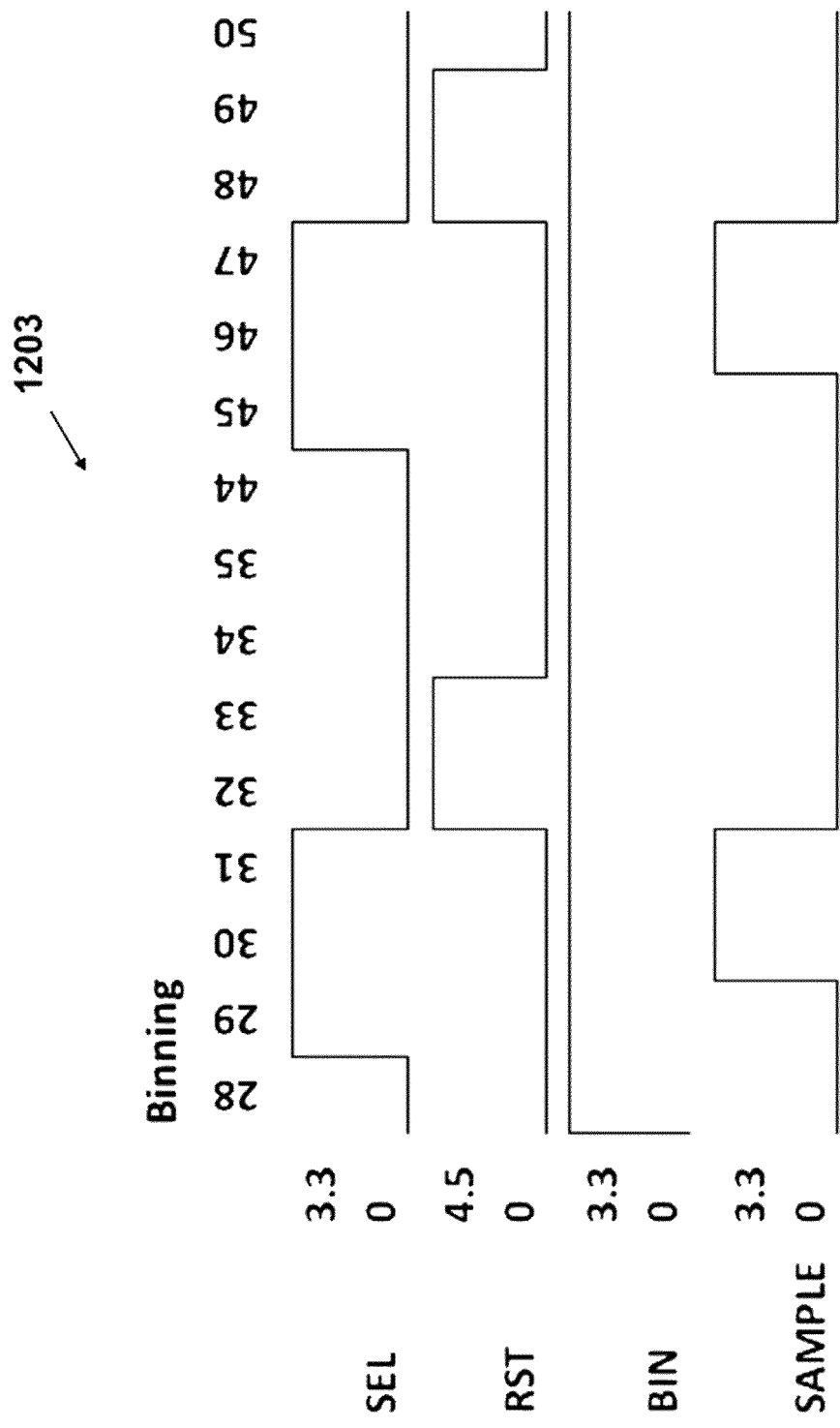
FIG. 4B illustrates a timing diagram for the pixel circuit of FIG. 3 in binning mode.

The timing diagrams 1202, 1203 of FIGS. 4A and 4B shows how the pixel circuit of FIG. 3 is operated without binning (FIG. 4A) or with binning (FIG. 4B). In an example, the BIN transistor may be a PMOS (see Sedgwick et Al.). The polarity of the Bin signal may be changed accordingly in case a PMOS transistor is used.

At low light level, i.e. high voltages, the BIN transistor needs to be fully closed to allow the correct sharing of charges between the two diodes (see FIG. 3). An NMOS transistor does not pass high voltages well, i.e. "1" in digital logic, while a PMOS transistor lets high voltages well but may have problems at low voltages. Consequently, for the binning, a PMOS transistor may be used.

A disadvantage of using a PMOS, is that it is integrated in an NWELL. This well is of the same type of doing of the diode and then it starts competing with the diode for charge collection, thus reducing the quantum efficiency, a very important performance metric for the pixel.

In addition, an NWELL requires more space in the pixel, thus making very difficult to use it for small pixels. In a prior art example, a pixel (see Sedgwick et Al.) designed for X-ray arrays had a pixel size of about 50 µm, i.e. large enough to add an NWELL without affecting the quantum efficiency of the pixel. In the example, to avoid 'charge stealing', a deep P implant i.e. deep Pwell, surrounding the Nwell was integrated. Such integration solved the problem of 'charge stealing', (see Bailin), however, it made the footprint of the PMOS transistor even bigger.

In case an NMOS transistor is used for binning, the threshold Vth of the transistor would have to be adjusted, in order to obtain an adequate performance in binning with low light level. That is, a high voltage swing would be obtained. An NMOS transistor having low Vth may therefore be used for the BIN transistor, but the RST transistor would need to be high Vth to prevent leakage during all modes of operation. A low Vth BIN transistor may give reasonable performance from the point of view of preserving the low light level performance. However, other problems would arise e.g. in the HDR mode (see FIG. 5). When used in the no binning mode, the gate of the BIN transistor would need to be driven very low or even negative in order to avoid charge leaking from a heavily illuminated pixel to a neighbouring one through the BIN transistor.

It should also be noted that in some binned circuits the binning is done by introducing an extra transistor, either PMOS or NMOS, for each extra pixel which is binned. This means, for example, that in the case of a 2×1 binning, where two pixels are binned together, one extra transistor is added, while in the case of a 2×2 binning, where four pixels are binned together, then three binning transistors are added. In general, in such binned circuits, if N pixels are binned together, the binned circuits would require at least N−1 extra transistors, and often an extra transistor would be added for symmetry, making the total equal to N.

Examples according to the present disclosure enable simultaneously solving the problem of binning and HDR without performance loss therefore obtaining high performance pixel circuits with binning and HDR. Also only one extra transistor is added for any binning configuration. This reduced transistor count means it is possible to do smaller pixel circuits for the same fill factor, or it is possible to have a higher fill factor for the same pixel circuit size.

Figure 5:
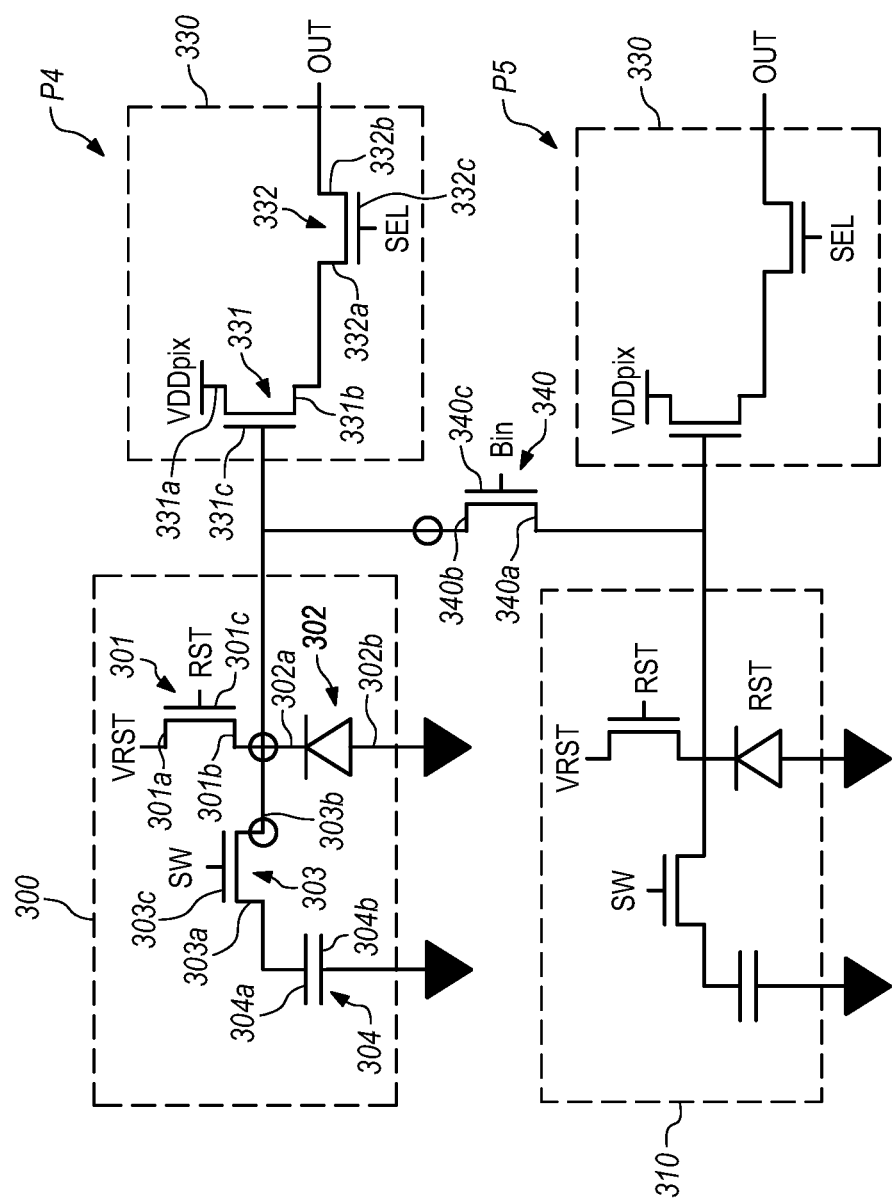
FIG. 5 schematically illustrates a high dynamic range (HDR) pixel circuit.

FIG. 5 shows a high dynamic range (HDR) pixel circuit comprising two pixels P4 and P5 and a binning transistor 340. Pixel 4 may comprise an input circuit 300 and an output circuit 330. The input circuit 300 may comprise a transistor 301 e.g. a reset transistor, which may comprise three terminals 301a, 301b and 301c; and a diode 302 e.g. a Nwell to substrate, P to Nwell, N to P-substrate, partially pinned photodiode, etc., which may comprise two terminals 302a and 302b. The input circuit 300 may further comprise a switch transistor 303 which may comprise three terminals 303a, 303b and 303c; and a capacitor 304 which may comprise two terminals 304a and 304b. The output circuit 330 may comprise a pixel transistor 331 which may comprise three terminals 331a, 331b and 331c and; a selector transistor 332 which may comprise three terminals 332a, 332b and 332c. Terminal 302a of diode 302 may be coupled to terminal 301b of transistor 301, to terminal 303a of transistor 303 and to terminal 331c of transistor 331. Terminal 302b of the diode may be coupled to ground. Terminal 301c of transistor 301 may be connectable to a reset control signal. Terminal 301a of transistor 301 may be connectable to voltage source VRST. Terminal 301b may be coupled to terminal 331c of pixel transistor 331 and to terminal 340a of binning transistor 340. Terminal 303c of transistor 303 may be connectable to a switch control signal. Terminal 303b of transistor 303 may be coupled to terminal 304a of capacitor 304. Terminal 304b of capacitor 304 may be coupled to ground. Terminal 331a of transistor 331 may be connectable to voltage source VDDpix. Terminal 331b of transistor 331 may be coupled to terminal 332a of selector transistor 332. Terminal 331c of transistor 331 may be coupled to terminal 340a of binning transistor 340. Terminal 332c of selector transistor 332 may be connectable to a selection control signal. Terminal 332b of selector transistor 332 may be connectable to an output device. Pixel P5 may comprise an input circuit 310 and an output circuit 330 similar to the ones of pixel P4. Terminal 340c of binning transistor 340 may be connectable to a binning control signal. Terminal 340b of binning transistor 340 may be coupled to the output terminal of input circuit 310 and to the input terminal of output circuit 330. The output OUT of pixel P5 may be connected to the output OUT of pixel P4.

FIG. 5 shows the schematic in the case an overflow stage is added for HDR operation. As a further junction is added, a further increase leakage current occurs.

In the example of FIG. 5, NMOS transistors may be used. The comments made above for FIG. 3 on the use of PMOS transistors remain valid.

Figure 6A:
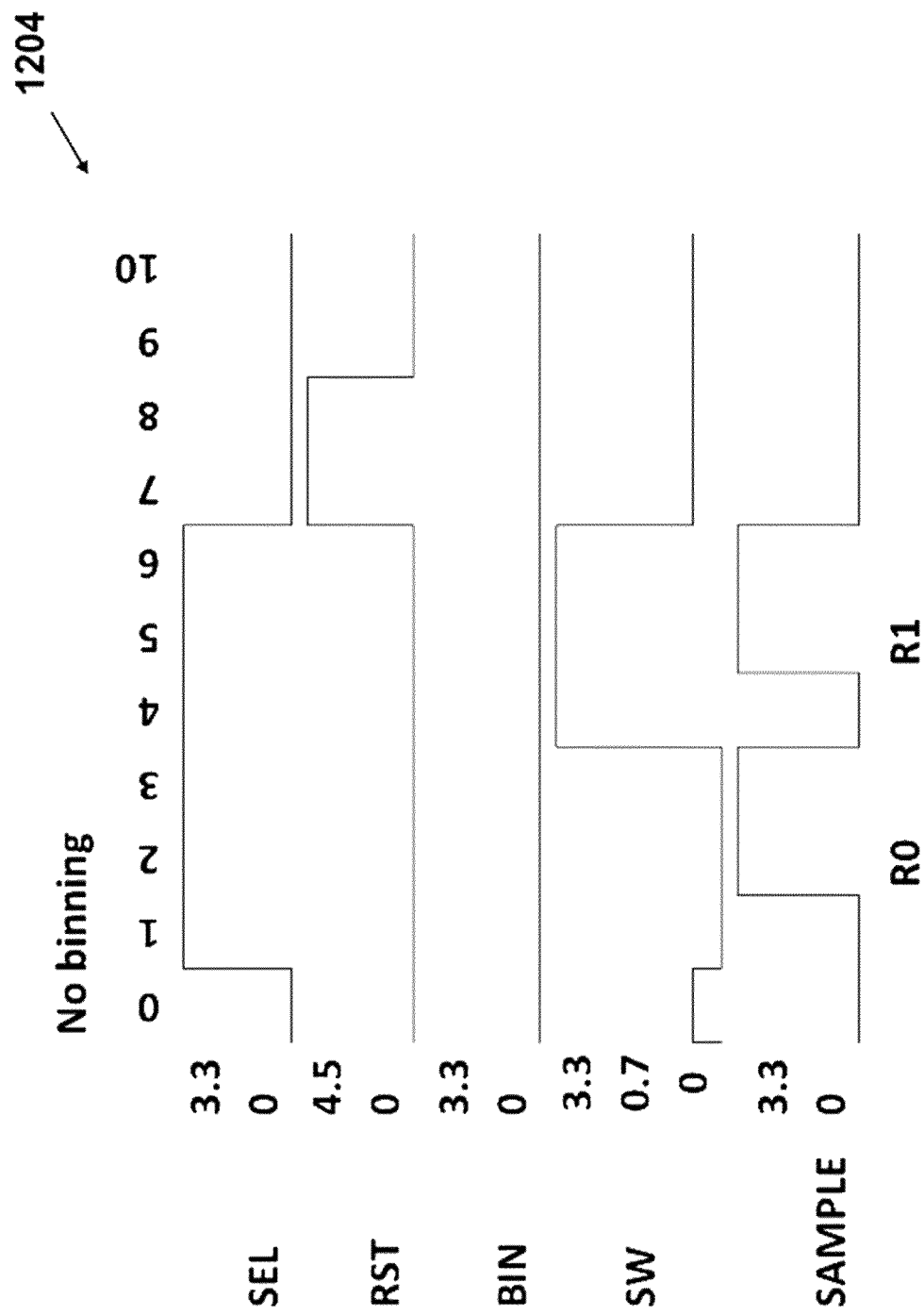
FIG. 6A illustrates a timing diagram for the pixel of FIG. 5 in no binning mode.

FIGS. 6A and 6B schematically illustrate timing diagrams 1204, 1205 for the HDR pixel circuit of FIG. 5 in no binning and binning modes respectively.

Note that in FIG. 5, as well as the following, all transistors are supposed to be NMOS. This is not a restriction as normally imaging pixels may not have PMOS transistors as this latter would require an NWELL for their integration, thus increasing the size of the pixel as well as introducing potential problems of parasitic charge collection (see Bailin). In any case it is understood that PMOS transistors could also be used for some of the functions described below. It is also understood that complementary versions with PMOS instead of NMOS transistors could also be considered and could be beneficial in some cases.

Figure 7:
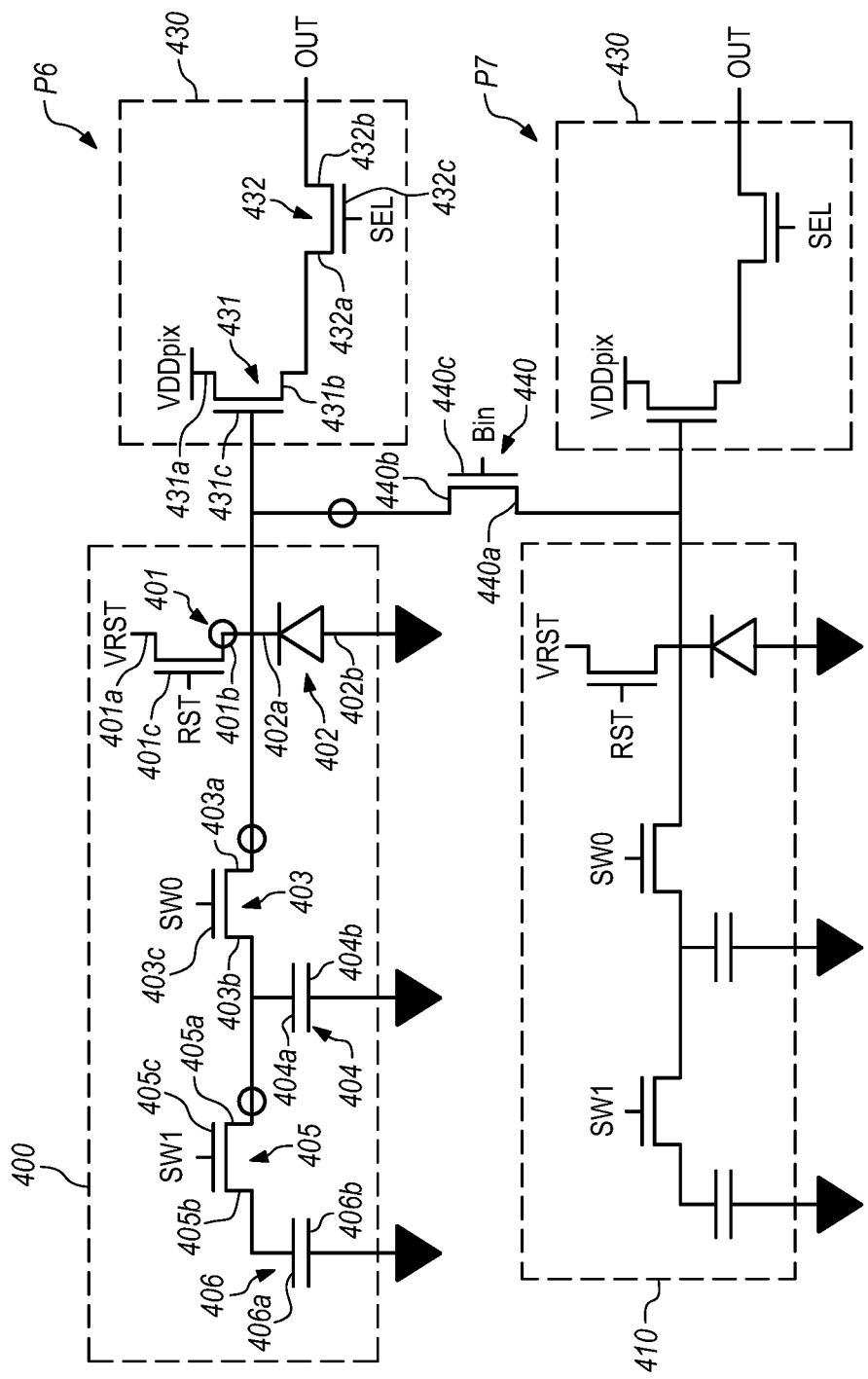
FIG. 7 schematically illustrates a pixel circuit according to an example.

FIG. 7 depicts a pixel circuit comprising two pixels P6 and P7, and a binning transistor 440. The pixel circuit of FIG. 7 may be used if additional gain selection is desirable. Pixel 6 may comprise an input circuit 400 and an output circuit 430. The input circuit 400 may comprise a reset transistor 401 which may comprise three terminals 401a, 401b and 401c; and a diode 402 e.g. a Nwell to substrate, P to Nwell, N to P-substrate, partially pinned photodiode, etc., which may comprise two terminals 402a and 402b. The input circuit 400 may further comprise a switch transistor 403 which may comprise three terminals 403a, 403b and 403c; a switch transistor 405 which may comprise three terminals 405a, 405b and 405c, a capacitor 404 which may comprise two terminals 404a and 404b; and a capacitor 406 which may comprise two terminals 406a and 406b. The output circuit 430 may comprise a pixel transistor 431 which may comprise three terminals 431a, 431b and 431c; and a selector transistor 432 which may comprise three terminals 432a, 432b and 432c. Terminal 402a of diode 402 may be coupled to terminal 401b of transistor 401, to terminal 403a of transistor 403 and to terminal 431c of transistor 431. Terminal 402b of the diode may be coupled to ground. Terminal 401c of transistor 401 may be connectable to a reset control signal. Terminal 401a of transistor 401 may be connectable to voltage source VRST. Terminal 401b may be coupled to terminal 431c of pixel transistor 431 and to terminal 440a of binning transistor 440. Terminal 403c of transistor 403 may be connectable to a switch control signal SW0. Terminal 403b of transistor 403 may be coupled to terminal 404a of capacitor 404 and to terminal 405a of transistor 405. Terminal 404b of capacitor 404 may be coupled to ground. Terminal 405c of transistor 405 may be connectable to a switch control signal SW1. Terminal 405b of transistor 405 may be coupled to terminal 406a of capacitor 406. Terminal 406b of capacitor 406 may be coupled to ground. Terminal 431a of transistor 431 may be connectable to voltage source VDDpix. Terminal 431b of transistor 431 may be coupled to terminal 432a of selector transistor 432. Terminal 431c of transistor 431 may be coupled to terminal 440a of binning transistor 440. Terminal 432c of selector transistor 432 may be connectable to a selection control signal. Terminal 432b of selector transistor 432 may be connectable to an output device. Pixel 7 may comprise an input circuit 410 and an output circuit 430 similar to the ones of pixel P6. The output OUT of pixel P7 may be connected to the output OUT of pixel P6.

Terminal 440c of binning transistor 440 may be connectable to a binning control signal. Terminal 440b of binning transistor 440 may be coupled to output terminal of input circuit 410 and to input terminal of output circuit 430.

Figure 8:
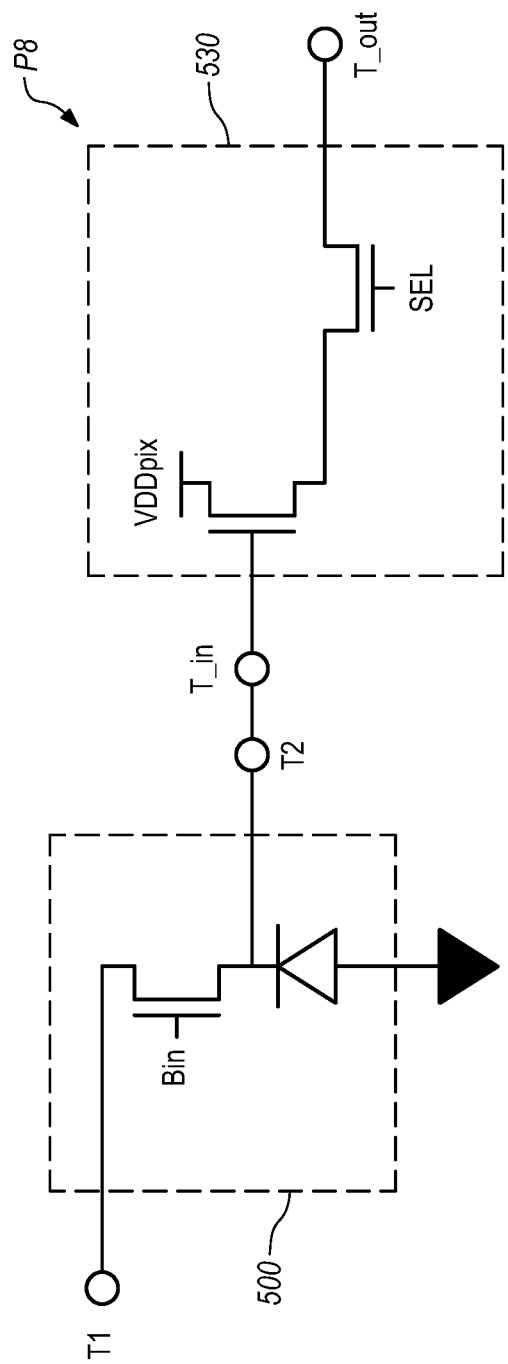
FIG. 8 schematically illustrates a binning pixel according to an example.

FIG. 8 shows a pixel circuit comprising a pixel P8 which may comprise an input circuit 500 and an output circuit 530. Input circuit may have an input terminal T1 and an output terminal T2. In the example of FIG. 8, the input circuit comprises a binning transistor and a diode. Output circuit 530 may have an input terminal T_in and an output terminal T_out. The output circuit 530 may comprise a pixel transistor and a selector transistor.

Figure 8A:
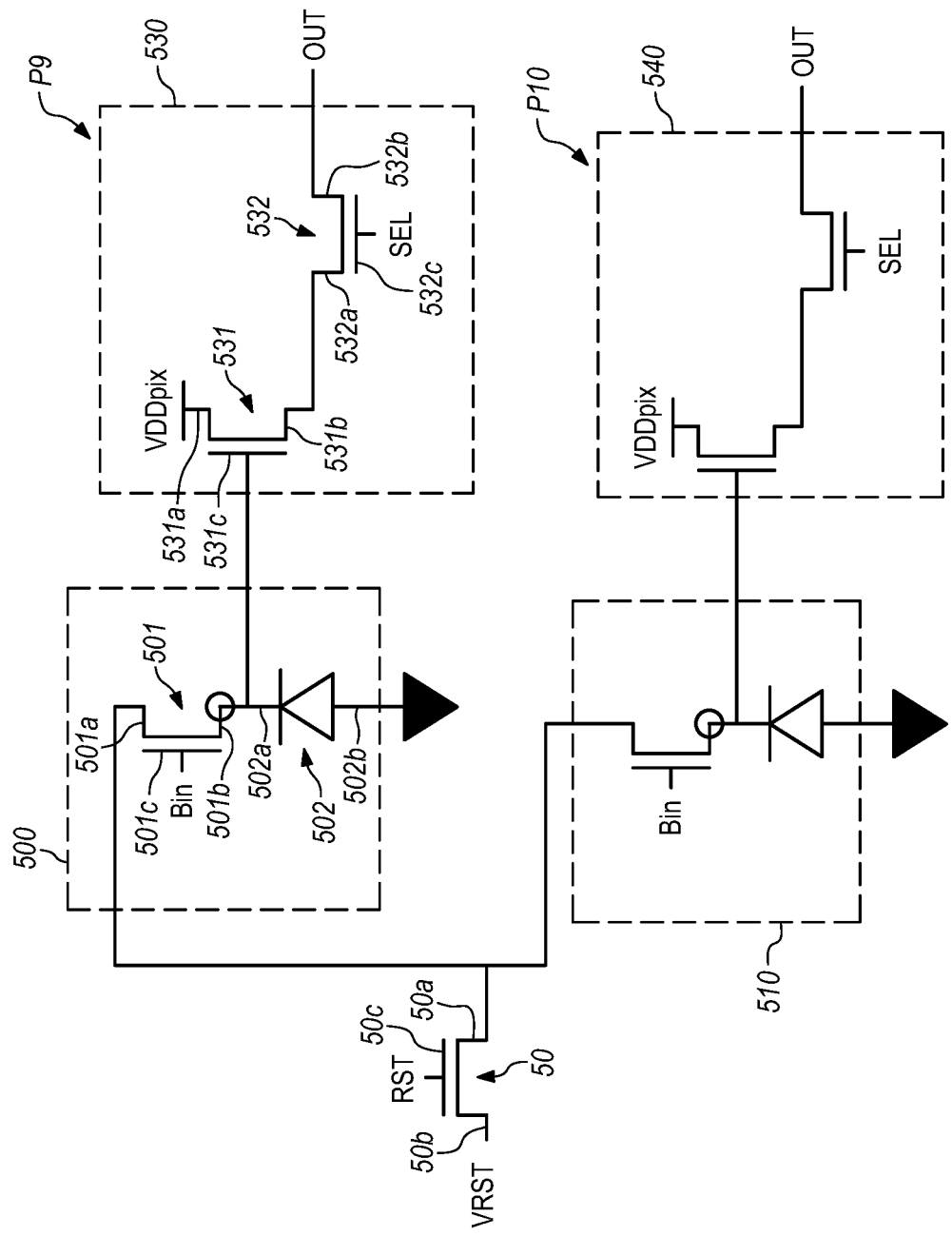
FIGS. 8A and 8B illustrate pixel circuits according to examples.

FIG. 8A shows a pixel circuit comprising two pixels P9 and P10; and a reset transistor 50 which may comprise three terminals 50a, 50b and 50c. Pixel 9 may comprise an input circuit 500 and an output circuit 530. The input circuit 500 may comprise a binning transistor 501 which may comprise three terminals 501a, 501b and 501c, a diode 502 e.g. a Nwell to substrate, P to Nwell, N to P-substrate, partially pinned photodiode, etc., which may comprise two terminals 502a and 502b. The output circuit 530 may comprise a pixel transistor 531 which may comprise three terminals 531a, 531b and 531c; and a selector transistor 532 which may comprise three terminals 532a, 532b and 532c. Terminal 502a of diode 502 may be coupled to terminal 501b of transistor 501 and to terminal 531c of transistor 531. Terminal 502b of the diode may be coupled to ground. Terminal 501c of transistor 501 may be connectable to a binning control signal. Terminal 501a of transistor 501 may be coupled to terminal 50a of transistor 50. Terminal 501b may be coupled to terminal 531c of pixel transistor 531. Terminal 531a of transistor 531 may be connectable to voltage source VDDpix. Terminal 531b of transistor 531 may be coupled to terminal 532a of selector transistor 532. Terminal 532c of selector transistor 532 may be connectable to a selection control signal. Terminal 532b of selector transistor 532 may be connectable to an output device. Pixel P10 may comprise an input circuit 510 and an output circuit 530 similar to the ones of pixel P9. Terminal 50c of transistor 50 may be connectable to a reset control signal RST. Terminal 50b transistor 50 may be connectable to a voltage source VRST. Terminal 50a of transistor 50 may be coupled to input terminal of input circuit 510. The output OUT of pixel P10 may be connected to the output OUT of pixel P9.

Figure 8B:
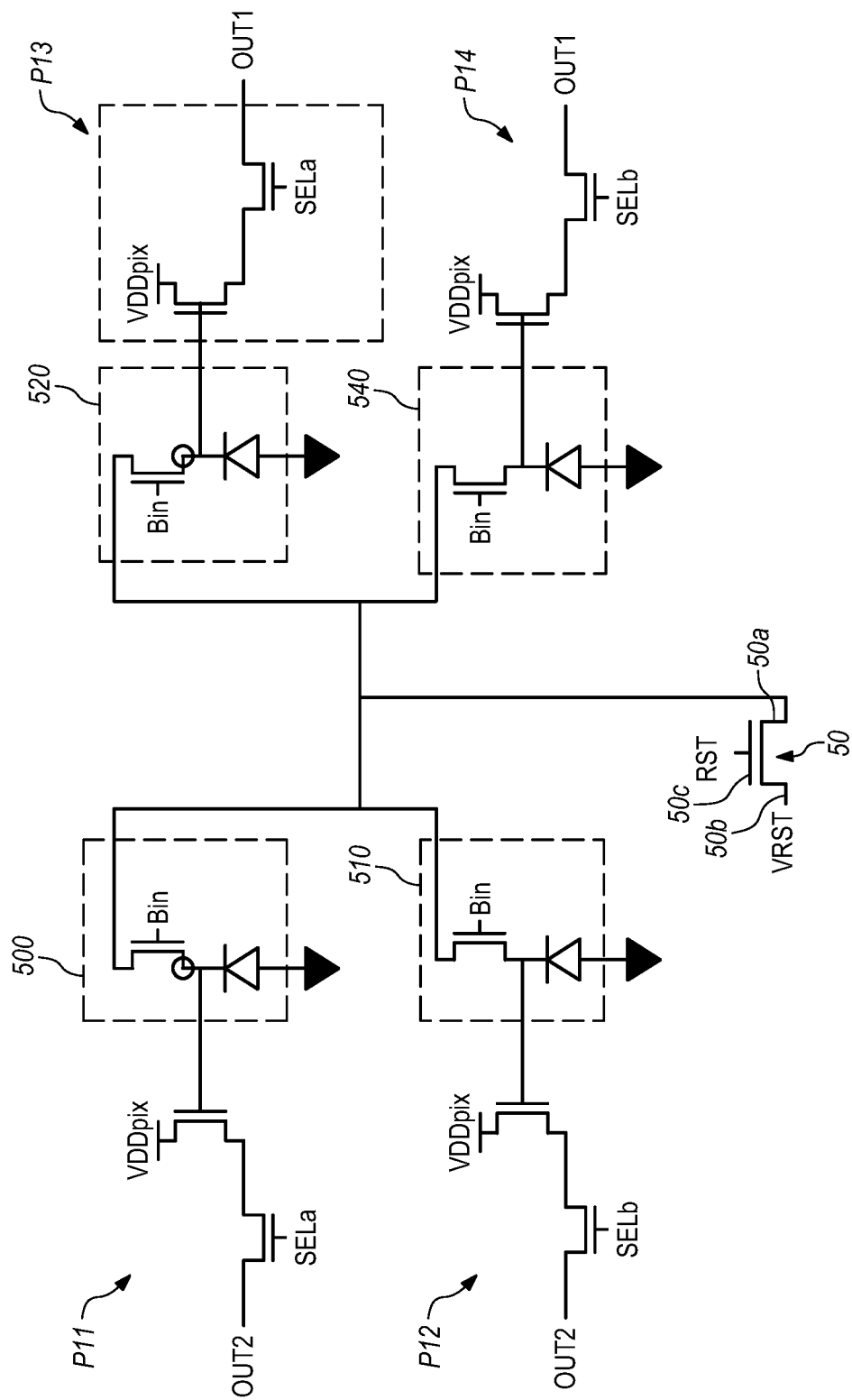

FIG. 8B shows a pixel circuit comprising four pixels P11, P12, P13, and P14; a reset transistor 50. Each pixel may comprise an input circuit 500, 510, 520 and 540; and an output circuit 530 similar to the ones of P9. Input terminal of each input circuit may be coupled to terminal 50a of reset transistor 50. The output OUT1 of pixel P14 may be connected to the output OUT1 of pixel P13. Accordingly, the output OUT2 of pixel P12 may be connected to the output OUT2 of pixel P11.

The FIG. 8A shows an example having a different arrangement and an operation mode of the transistors. The figure shows the charge domain binning for two pixels but any number of pixels may be used. In an example (see FIG. 8B), four pixels may be used for symmetry considerations and to avoid long routing between non-neighbouring pixels. The examples of FIGS. 8A and 8B differ from prior art in that only one transistor junction is attached to the PPPD, i.e. the same number as in FIG. 1A, which, however, does not perform binning.

Figure 9A:
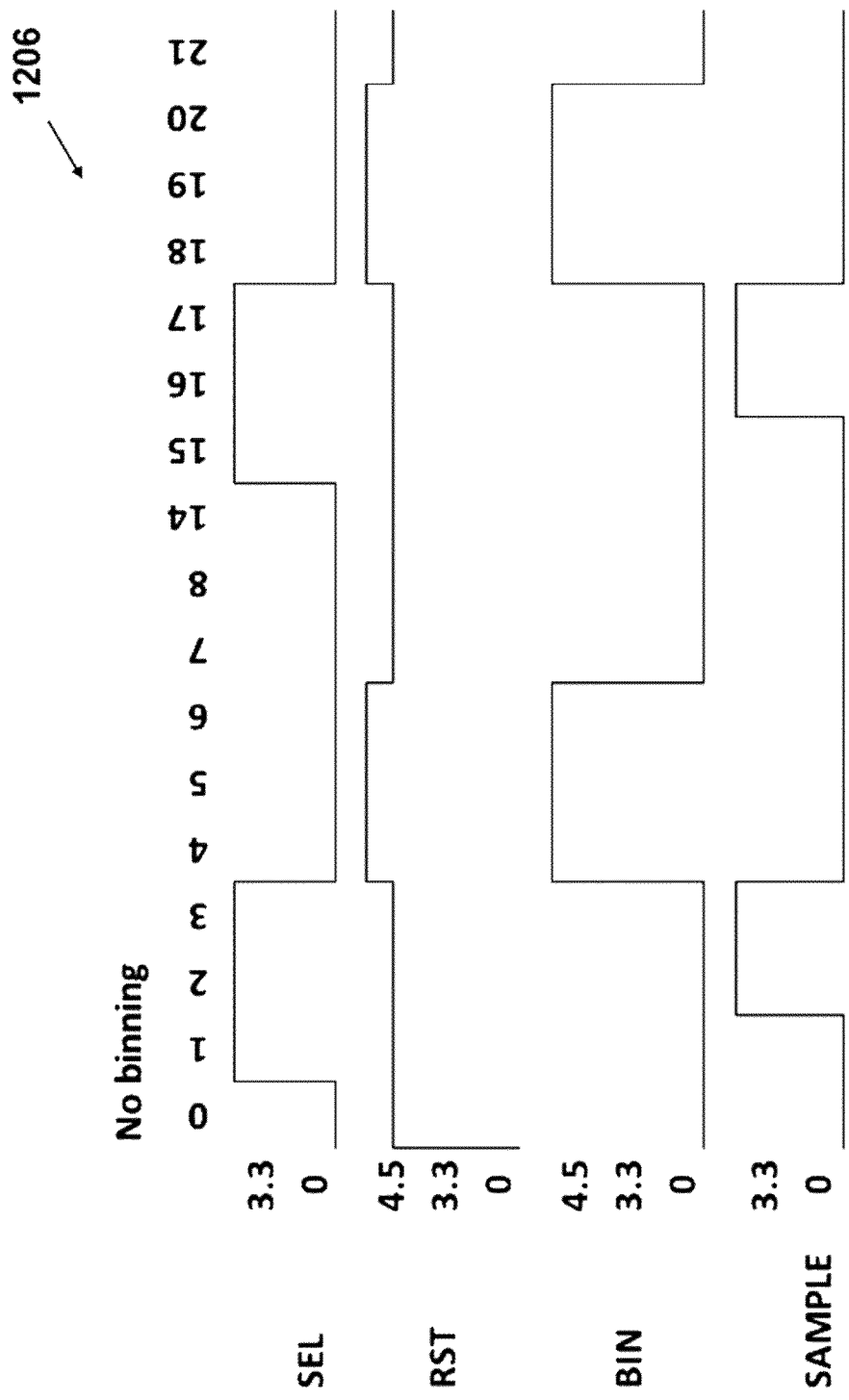
FIG. 9A illustrates a timing diagram for the binning pixel of FIG. 8A in no binning mode.
Figure 9B:
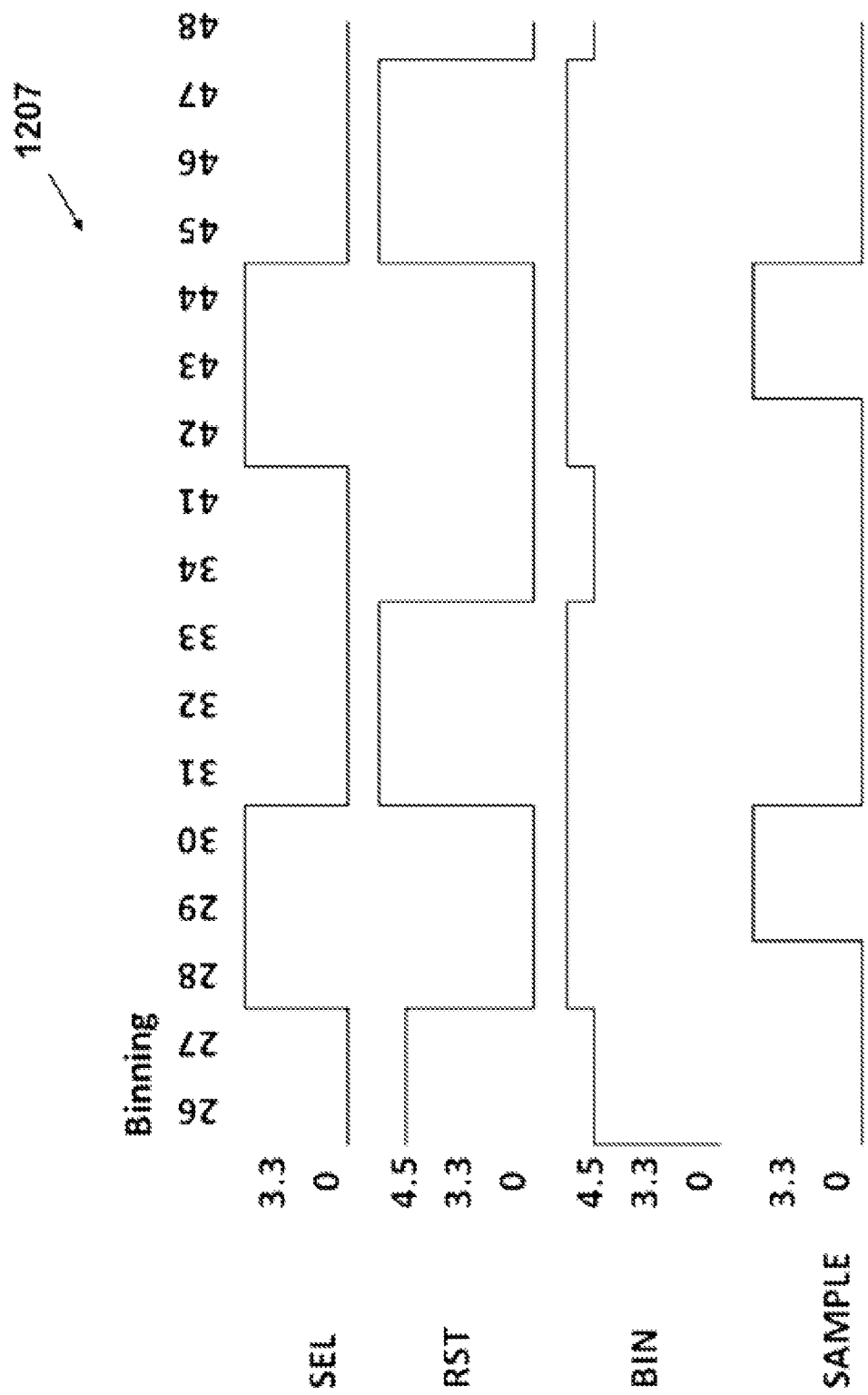
FIG. 9B illustrates a timing diagram for the binning pixel of FIG. 8A in binning mode.

FIGS. 9A and 9B depict timing diagrams 1206, 1207 and describe the operation mode of the pixel circuit of FIG. 8A both with and without binning. Starting from the non-binned mode, the pixel resetting requires both BIN and RST transistors to be fully on and overdriven. During integration, the BIN transistor may be turned off to separate adjacent pixels. The RST transistor may also be turned off, but this would let the node between BIN transistor and RST transistor floating. If photocurrent or leakage is collected to this point, there may be a risk that the voltage on this node gradually decreases and goes below 0, thus causing the BIN transistor to go in weak inversion and eventually to be fully turned on, thus shorting adjacent pixels. In order to avoid this problem, the RST transistor may be kept to a voltage which has to be high enough to allow flow of charges from the BIN-RST mid-point to the power supply VRST, but also low enough to avoid the RST transistor to operate outside of this normal rated voltage for a long period. In the example of FIG. 9A, the pixel circuit may be designed in a 3.3 V technology and the hold voltage for the RST transistor may be set to 3.3 V, however, any other voltage between one Vth about ground, corresponding to about 0.7 V and the maximum rated voltage, normally 3.3 V+10%, i.e. 3.63 V, may also be used.

In binning mode, a BIN transistor may operate in similar way to an RST transistor in the non-binding mode. That is, during integration, the BIN transistor may be kept to an intermediate voltage following the same rule described above for the RST transistor in the non-binning mode. In the FIG. 9B for the binning mode, 3.3 V may also be used but any other voltage may also be used. In an example, the voltage is different to the RST transistor voltage in the no-bin mode. In an example, the same voltage might be used i.e. to simplify the supply of power to the chip. For the chosen voltage, the BIN transistor operating at this intermediate voltage ensure sharing of most of the charge.

The complete sharing of the charge may be done during the readout by turning the voltage on the gate of the BIN transistor on to an overdriven voltage, i.e. 4.5 V in FIG. 9B. This is allowed as this is a rolling row operation and thus the duty cycle is reduced by at least the number of rows in the sensor, e.g. in excess of 1.000 or a few thousands. The RST transistor may be turned off during integration to isolate the node shared by two pixels from the power supply VDDpix. Although each pixel P9 and P10 of FIG. 8A have a separate output, in binning mode these two outputs may give the same voltage i.e. without taking into account the usual technological variations between devices.

In an example, only one of the outputs may be read e.g. to get the amount of collected charge, and thus, a speed increase proportional to the binning factor may be obtained. The junction between the RST and BIN transistors of FIG. 8A in binning mode may contribute to the leakage. However, the leakage with respect to the prior art may be reduced because in binning mode the overall capacitance is higher due to the binning operation. The noise would be higher, and therefore the noise coming from the increased leakage current would be less important. In addition, the gain is lower, which may make the change in DC line less important due to the leakage.

The coupling between BIN and RST transistors shown in FIG. 8A requires changes in the operation of the transistors as shown in the timing diagrams of FIGS. 9A and 9B. The BIN signal when connected as shown in FIG. 8A may have three distinct levels to operate. In the prior art, the BIN control signal is typically a global signal, i.e. it is applied to all pixels at the same time, which means that the BIN signal operates within the limit of the technology, i.e. without overdriving (see FIG. 10 and FIG. 11). This as an important implication on the full well of the sensor because the difference between the signal on the BIN gate and the PPPD signal needs to be higher than one threshold voltage Vth of the BIN transistor in order for the pixel to correctly operate also close to the reset level.

In the example of FIG. 3, the reset voltage VRST may be one Vth lower than the maximum operating voltage of the technology e.g. for values of Vth~1V for the 3.3V technology mentioned above, an equivalent reduction in available voltage swing may introduced, thus reducing the full well of the sensor in binning mode.

On the contrary, in the example of FIG. 8A, the BIN signal may be operated in a rolling, row-wise mode i.e. the BIN signal may be overdriven because of the small duty cycle, thereby improving the dynamic range of the sensor.

Alternatively, in the prior art, the P-type BIN transistor have been used (see Sedgwick et Al). However, using P-type transistor may have at least two disadvantages. Firstly, the transistor requires an additional deep P implant to screen the Nwell, which forms the substrate of the PMOS transistor. This additional deep P implant prevents this Nwell, i.e. the substrate of the PMOS, from collecting radiation-induced charge instead of the PPPD, therefore, the technology is more complicated and the pixel larger. Secondly, the BIN control PMOS transistor starts to turn off when the voltage in the PPPD goes towards full well, thus artefacts are generated in the response curve of the pixel.

In the prior art devices, the operating point of the BIN transistor, which is connected between the two diodes, depends on the voltage on the photodiode. Hence, the operating point would generally be different for different images. Two pixels are connected through the BIN transistor, and so, a perturbation may appear from one pixel to the other one because of that connection.

In the example of FIG. 8A, the voltage on the midpoint between the two BIN transistors may be controlled in order to keep it in a predetermined working place. The voltage on the photodiode on a pixel would not affect the voltage on the other pixel, a source of cross-talk may therefore be eliminated.

In the examples according to the disclosure, the common node between RST and BIN transistor may be decoupled from the diode and so it would not contribute to the leakage current in the no-bin mode. This makes it possible to change its size and having it larger that it would be in case it contributes to leakage current.

Such advantage may be important in large sensors e.g. in sensors used in X-digital imaging, where it may be desirable to avoid the minimum dimensions allowed by the technology as it is known that using minimum dimensions could reduce the manufacturing yield of the sensor. In cases where large sensors are used, there may only be a few sensors or a single one on each wafer, and so any sensor lost may have negative effect on the yield. For example, in case of wafer-scale sensors, losing one sensor would make the yield of the wafer equal to zero percent.

In the example of FIG. 8A and in the examples disclosed herein, the control signals like RST, SEL, BIN, SW(0/1) and AB, are meant to be controlled in a row-wise way, i.e. every pixel in a row may receive the same control signal. In some specific cases, e.g. RST for doing global reset, some signals could also be driven in a global way, but the typical operating way is rolling.

In an example, each signal may be controlled at the pixel-base. This would require the addition of an extra transistor for each command that needs to be on a pixel-base. Such extra transistor would provide the column-way selection, a full XY addressability of the desired control line would be obtained.

Figure 10:
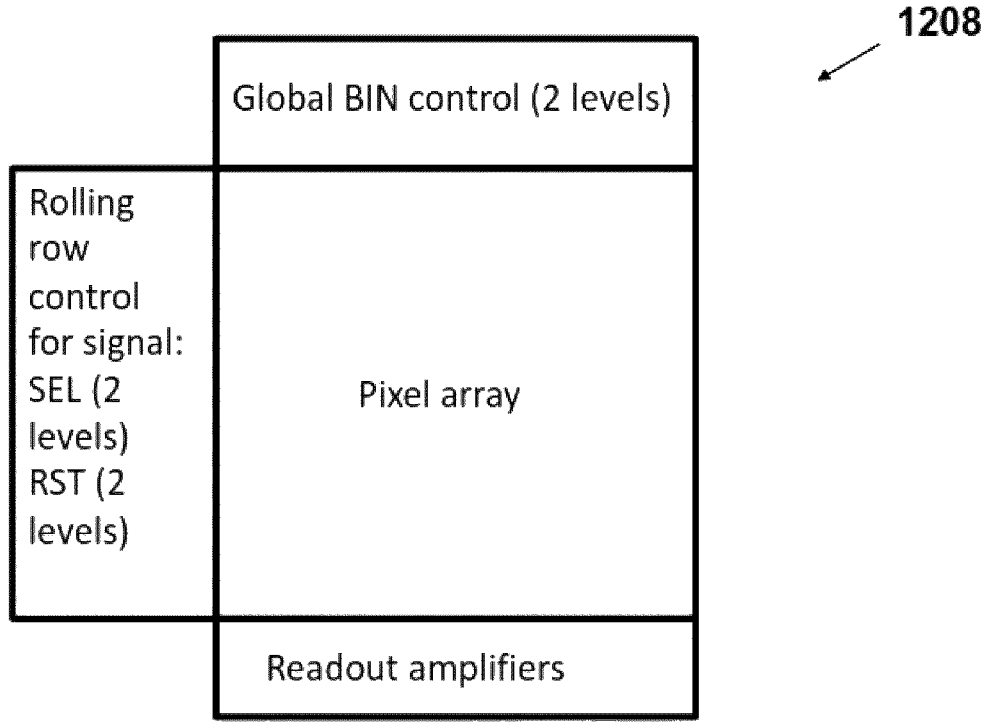
FIG. 10 schematically illustrates a sensor floorplan according to an example.

FIG. 10 schematically illustrates a floorplan 1208 of a sensor with a global control of the BIN signal. The allowed voltages for the BIN signal may be 0 and 3.3V in the considered technology.

Figure 11:
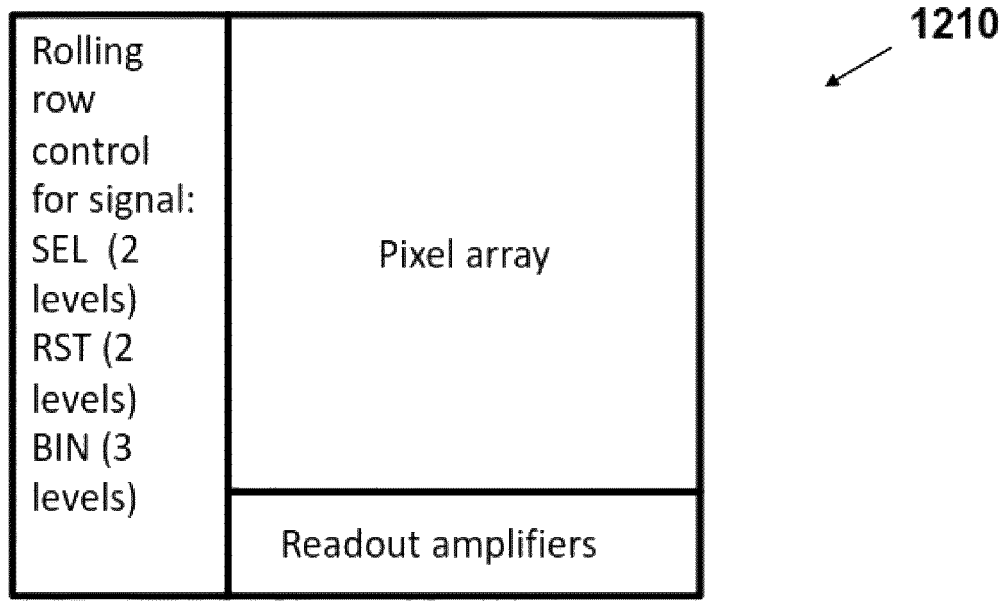
FIG. 11 schematically illustrates a sensor floorplan according to an example.

FIG. 11 schematically illustrates a floorplan 1210 of a sensor with a rolling control of the BIN signal. The allowed voltages for the BIN signal may be 0, 3.3V and an overdriving voltage, e.g. 4.5V, in the considered technology. The overdriving voltage will only be applied with a very small duty cycle.

Figure 12:
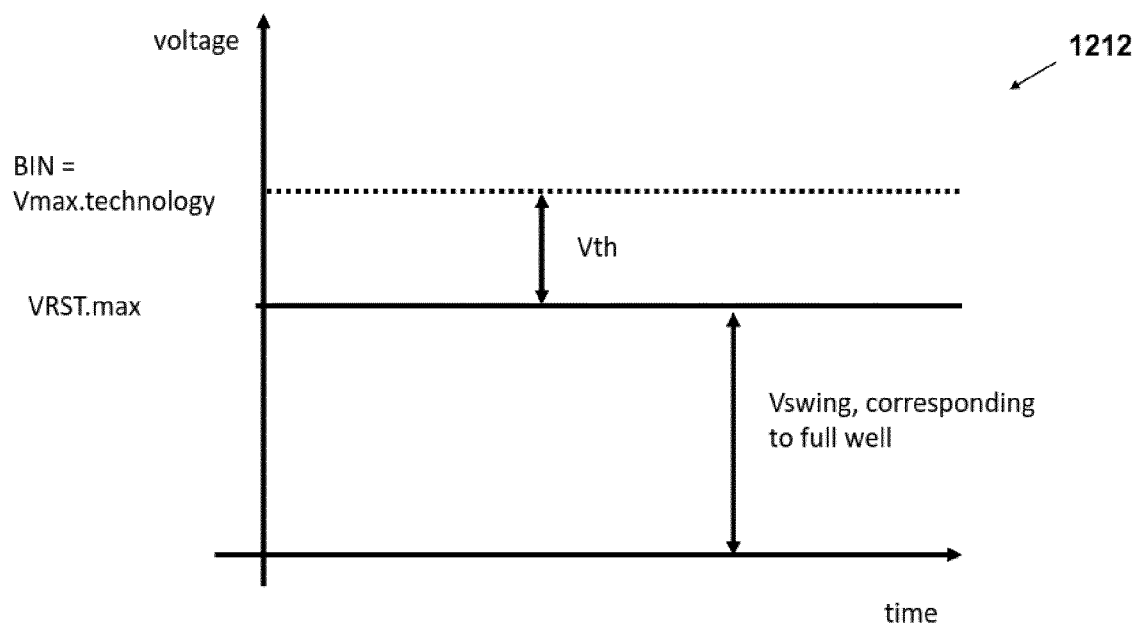
FIG. 12 schematically illustrates a voltage swing diagram of a binned circuit sensor as in FIG. 3.

FIG. 12 schematically illustrates voltage swing 1212 of a binned circuit sensor as in FIG. 3. BIN can only be set at the maximum of the technology, thus limiting the Vswing, hence the full well.

Figure 13:
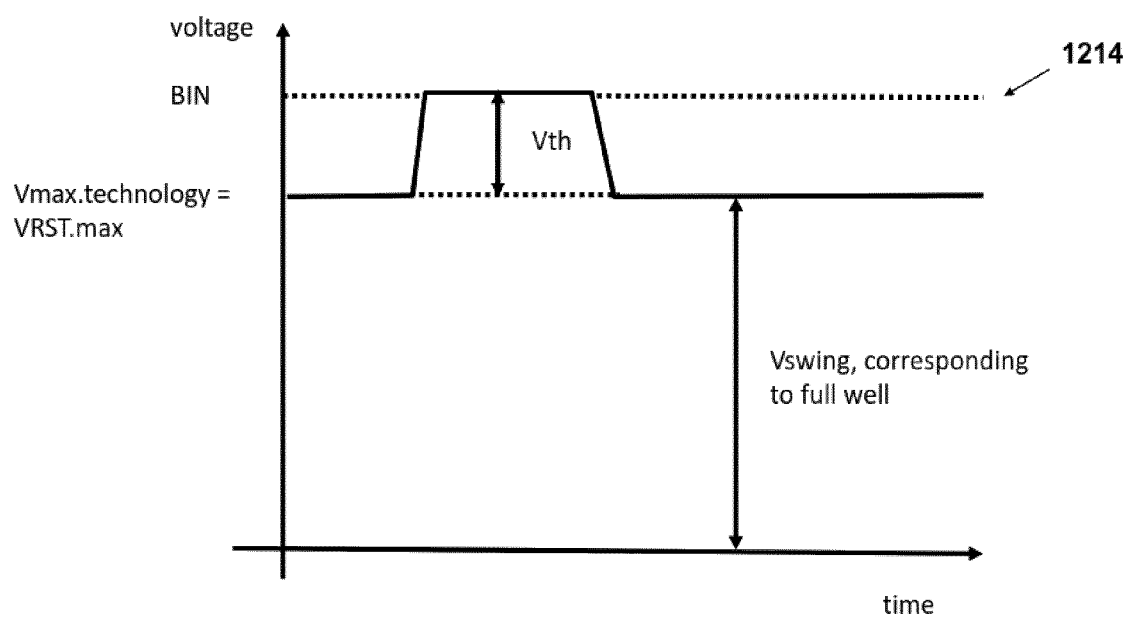
FIG. 13 schematically illustrates a voltage swing diagram of a binned circuit sensor using binned pixels as in FIG. 8A.

FIG. 13 schematically illustrates voltage swing 1214 of a binned circuit sensor using binned pixels as in FIG. 8A. The BIN voltage is a rolling signal and can be overdriven just for a short amount of time before the readout to allow full sharing of the charges, so that no Vth is lost in the full Vswing.

Figure 14:
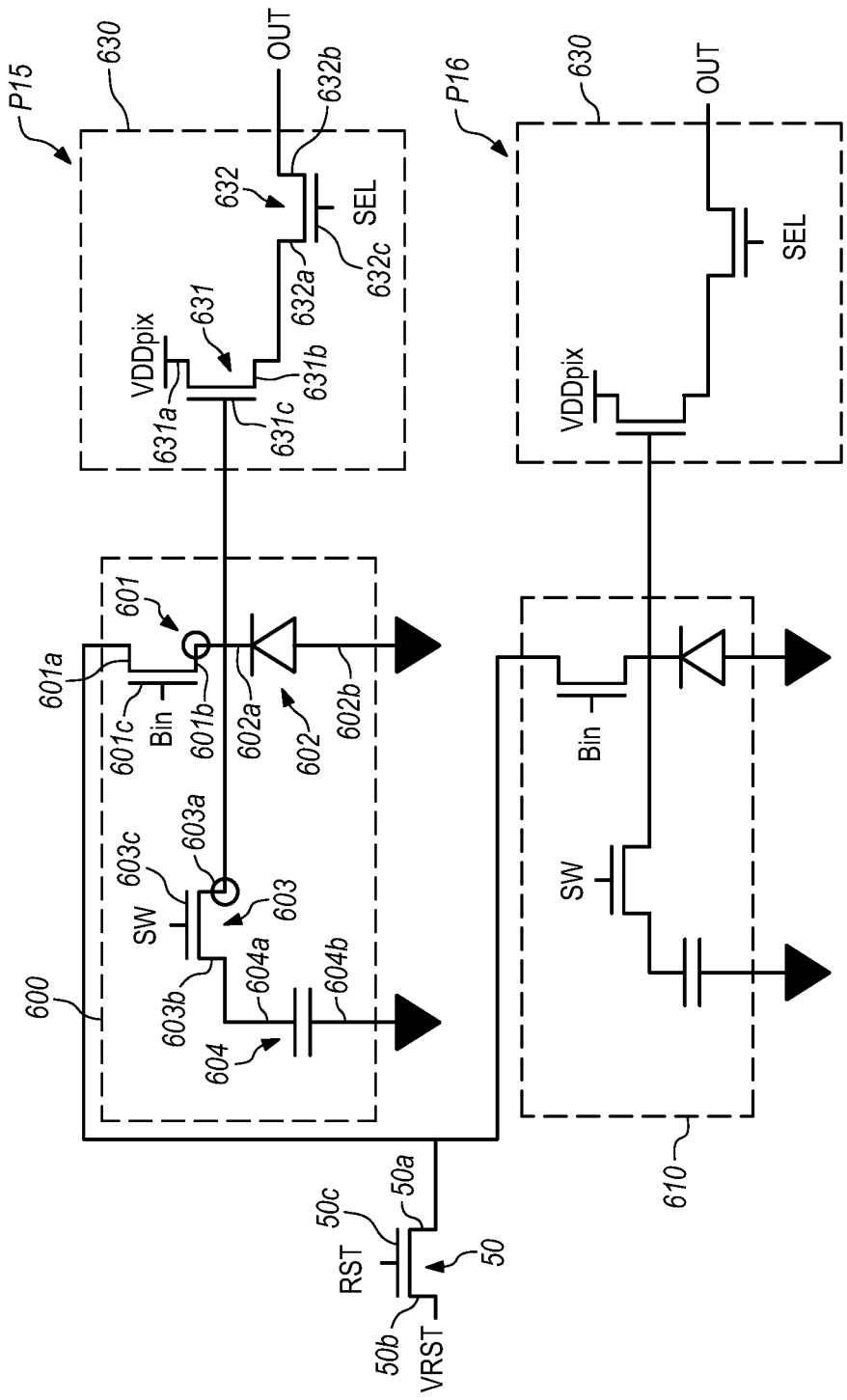
FIG. 14 schematically illustrates a binning pixel according to an example.

FIG. 14 illustrates a pixel circuit comprising two pixels P15 and P16; and a reset transistor 50. Pixel P15 may comprise an input circuit 600 and an output circuit 630. The input circuit 600 may comprise a binning transistor 601 e.g. a reset transistor, which may comprise three terminals 601a, 601b and 601c; a diode 602 e.g. a Nwell to substrate, P to Nwell, N to P-substrate, partially pinned photodiode, etc., which may comprise two terminals 602a and 602b. The input circuit may further comprise a switch transistor 603 which may have three terminals 603a, 603b and 603c; and a capacitor 604 which may comprise two terminals 604a and 604b. The output circuit 630 may comprise a pixel transistor 631 which may comprise three terminals 631a, 631b and 631c; and a selector transistor 632 which may comprise three terminals 632a, 632b and 632c. Terminal 602a of diode 602 may be coupled to terminal 601b of transistor 601 and to terminal 631c of transistor 631. Terminal 602b of the diode may be coupled to ground. Terminal 601c of transistor 601 may be connectable to a binning control signal. Terminal 601a of transistor 601 may be coupled to terminal 50a of transistor 50. Terminal 601b may be coupled to terminal 631c of pixel transistor 631 and to terminal 603a of transistor 603. Terminal 603 of transistor 603 may be connectable to a switch control signal. Terminal 603b of transistor 603 may be coupled to terminal 604a of capacitor 604. Terminal 604b of capacitor 604 may be coupled to ground. Terminal 631a of transistor 631 may be connectable to voltage source VDDpix. Terminal 631b of transistor 631 may be coupled to terminal 632a of selector transistor 632. Terminal 632c of selector transistor 632 may be connectable to a selection control signal. Terminal 632b of selector transistor 632 may be connectable to an output line. Pixel P16 may comprise an input circuit 610 and an output circuit 630. Terminal 50c of transistor 50 may be connectable to a reset control signal. Terminal 50b of transistor 50 may be connectable to a voltage source VRST. Terminal 50a of transistor 50 may be coupled to input terminal of input circuit 610. The output OUT of pixel P16 may be connected to the output OUT of pixel P15.

FIG. 14 depicts a pixel circuit according to FIG. 8A, further comprising an additional switch transistor 603 and a capacitor 604. The switch transistor may operate as conventional switch, i.e. being either closed or opened. In such case, the sensor would have a dual gain. In open mode, the capacitance at the diode would be small, thus the gain would be high, and the noise low. In case the sensor needs larger signals, the switch transistor 603 may be closed thereby connecting the capacitor 604 to the diode. The input capacitance and the noise would consequently be increased but the gain (and the full well of the sensor) would be reduced.

In an example, the switch transistor 603 may be operated so as to achieve a High Dynamic Range (HDR) operation mode with lateral overflow. The HDR operation mode may be either bin or no-bin mode.

Figure 15:
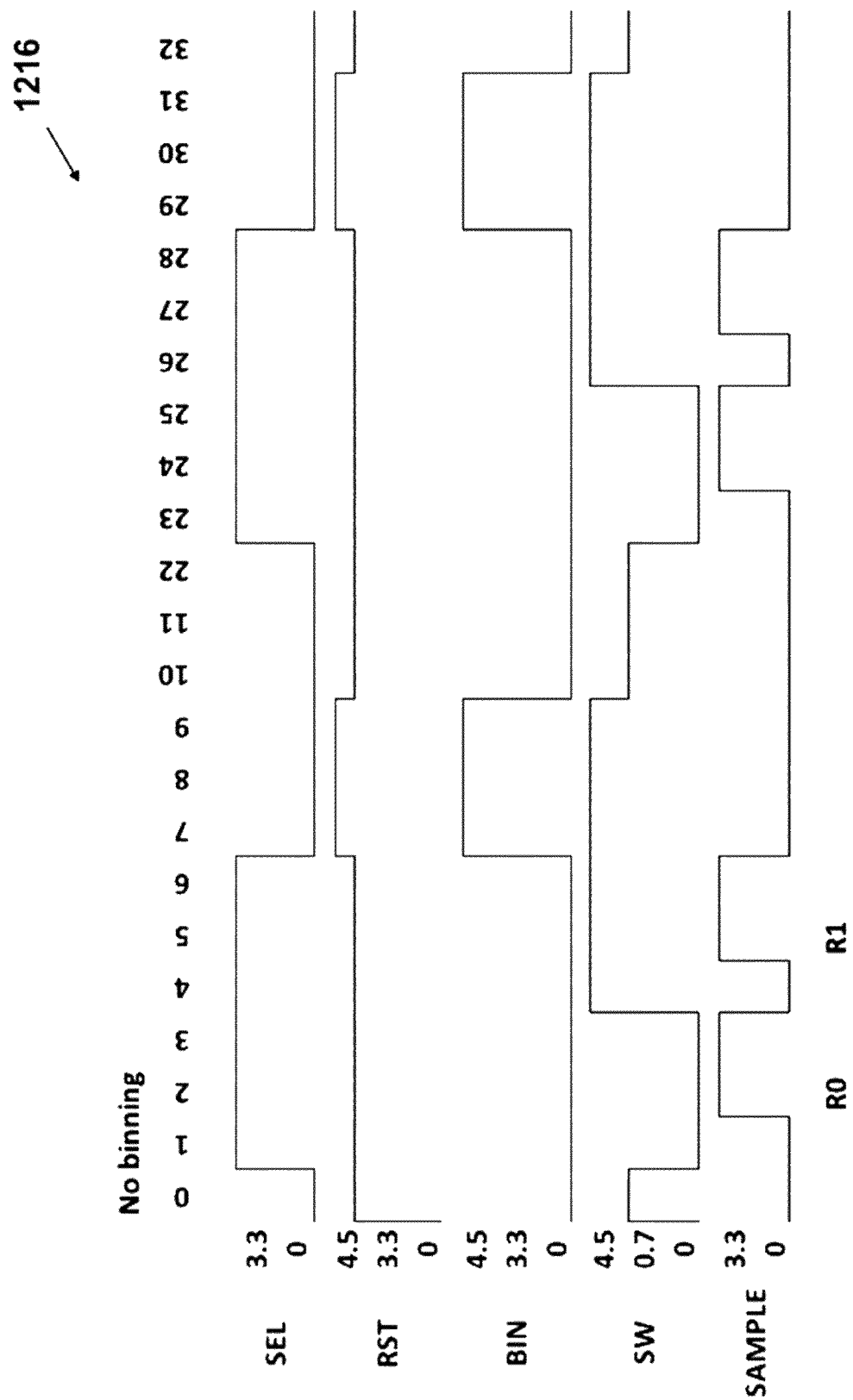
FIG. 15 illustrates a timing diagram for the binning pixel of FIG. 14 in no binning mode.

On the first hand, in the no-bin mode, the switch transistor may have a third level. In FIG. 15 a timing diagram 1216 of the example of FIG. 14 in no binning mode is shown in which such third level is indicated as 0.7 V. However, other levels may also be used, as explained below. During integration mode, the switch transistor may be biased at the intermediate level (VOF) e.g. 0.7 V. At reset, the PPPD may be biased at the high level VRST, e.g. at about 3.3 V. The switch transistor may then be totally switched off, as the capacitor would have also been reset e.g. at 3.3V.

As diode 602, e.g. PPPD, collects charge, its voltage decreases towards ground. When this voltage is close to Voltage Over Flow (VOF), then the switch transistor may start conducting. Any further collected charge will tend to move the diode 602 node even further down, thus increasing the conduction. This means that the node diode 602 cannot move away from VOF. The setting of VOF may determine at which level this effect occurs. All extra charge would overflow into the capacitor 604. This latter can be dimensioned to be able to collect a large amount of charge, as needed by the application. At the end of the integration period, the switch transistor is open, thus completely disconnecting diode 602 from capacitor and freezing the amount of charge on the two devices. A first read R0 may then be performed. Switch transistor 603 may be closed, thus connecting capacitor 604 and diode 602. The charge on capacitor 604 and diode 602 would be shared over the capacitor formed by their parallel connection. A second reading R1 may then be performed. After a second reading R1 the pixel circuit may be ready to be reset and a new integration period may start.

During the first reading R0 only the diode 602 may be connected. The gain during the first reading would be high, and the noise ENC0 and the full well FW0 would be low, while the voltage swing would be limited by both the intermediate voltage VOF value and the power supply rail. During the second reading R1, the capacitor 604 and the diode 602 may be connected in parallel, thus the capacitance would be high, the gain low, the noise ENC1 high and the full well FW1 high.

By combining both readings R0 and R1, a signal of up to FW1 may be read. For small signals, the first reading R0 can be used, which has a lower noise ENC0. The dynamic range of the combined reading may be calculated with the following formula:

$$HDR = \frac{FW1}{ENC0}$$

wherein the value of HDR is higher than both FW1/ENC1 and FW0/ENC0. HDR operation may thus be achieved. Due to the arrangement of BIN and RST transistors shown in FIGS. 8A and 14 (and in the following examples), low leakage current may also be achieved, which further increases the dynamic range e.g. in cases where the leakage current might become a limiting factor.

The noise generated by the leakage current is of shot noise type, its contribution is proportional to the square root of the integration time, thus as the integration time is increased, the effect increases.

On the other hand, in the bin mode, while the operation of the lateral overflow structure may be similar to the no-bin mode, the RST and BIN transistors may work as in the example of FIG. 8A. An arrangement of the transistors according to the examples of FIG. 8A and FIG. 14 may also preserve the HDR mode in the bin mode. Other binning modes, e.g. in the periphery, would not achieve the same result as charges are not mixed in the focal plane. As in the example of FIG. 8A, the pixel circuit of the example of FIG. 14 would have an extra leakage coming from the BIN-RST junction. However, due to the different values of capacitance, gain and noise in the bin mode of FIG. 14, the pixel circuit would not be negatively affected.

Figure 16:
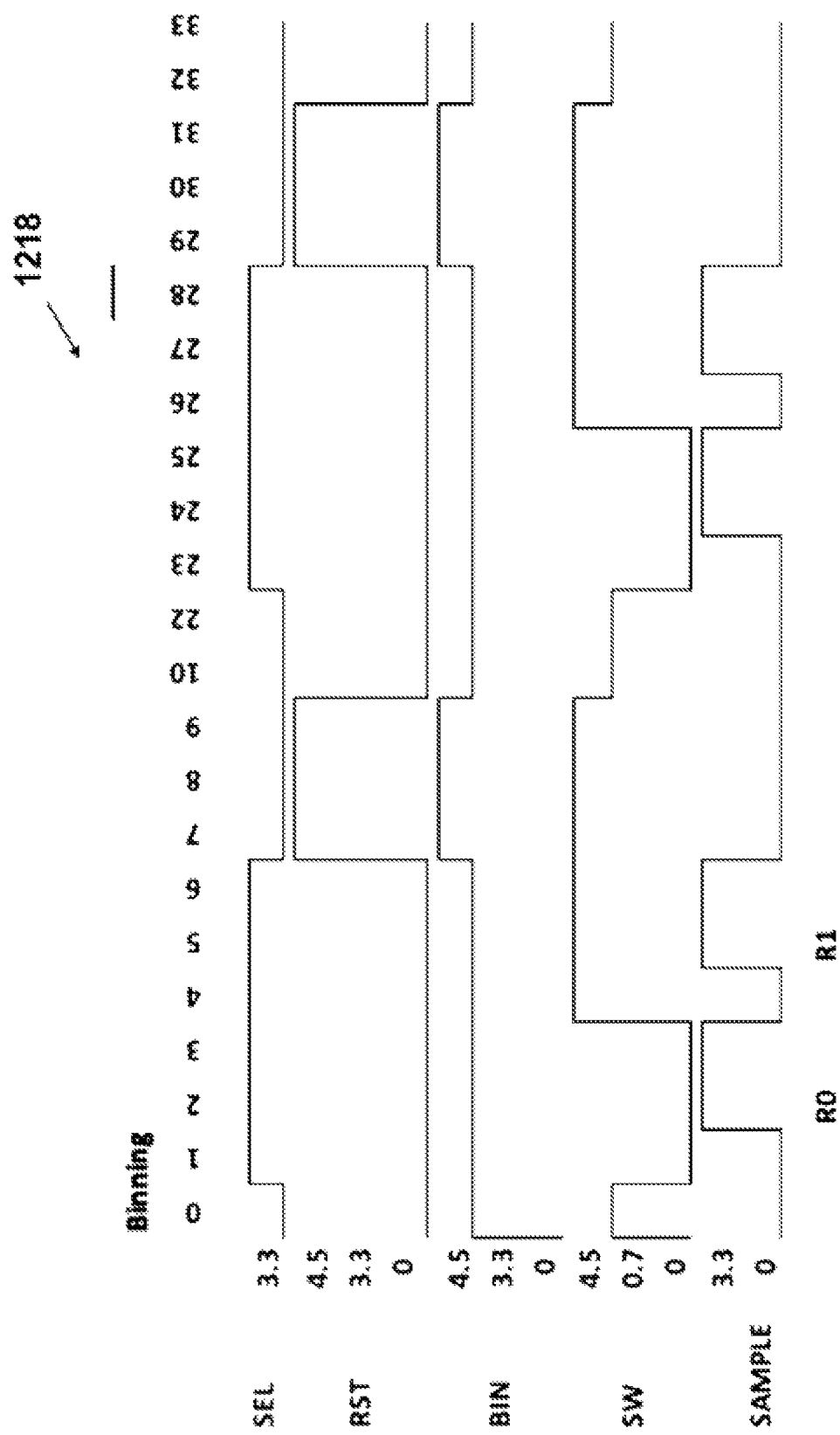
FIG. 16 illustrates a timing diagram in bin mode for the binning pixel of FIG. 14.

FIG. 16 shows timing diagram 1218 in bin mode for the example of FIG. 14 with improved charge binning and lateral overflow for HDR.

Figure 17:
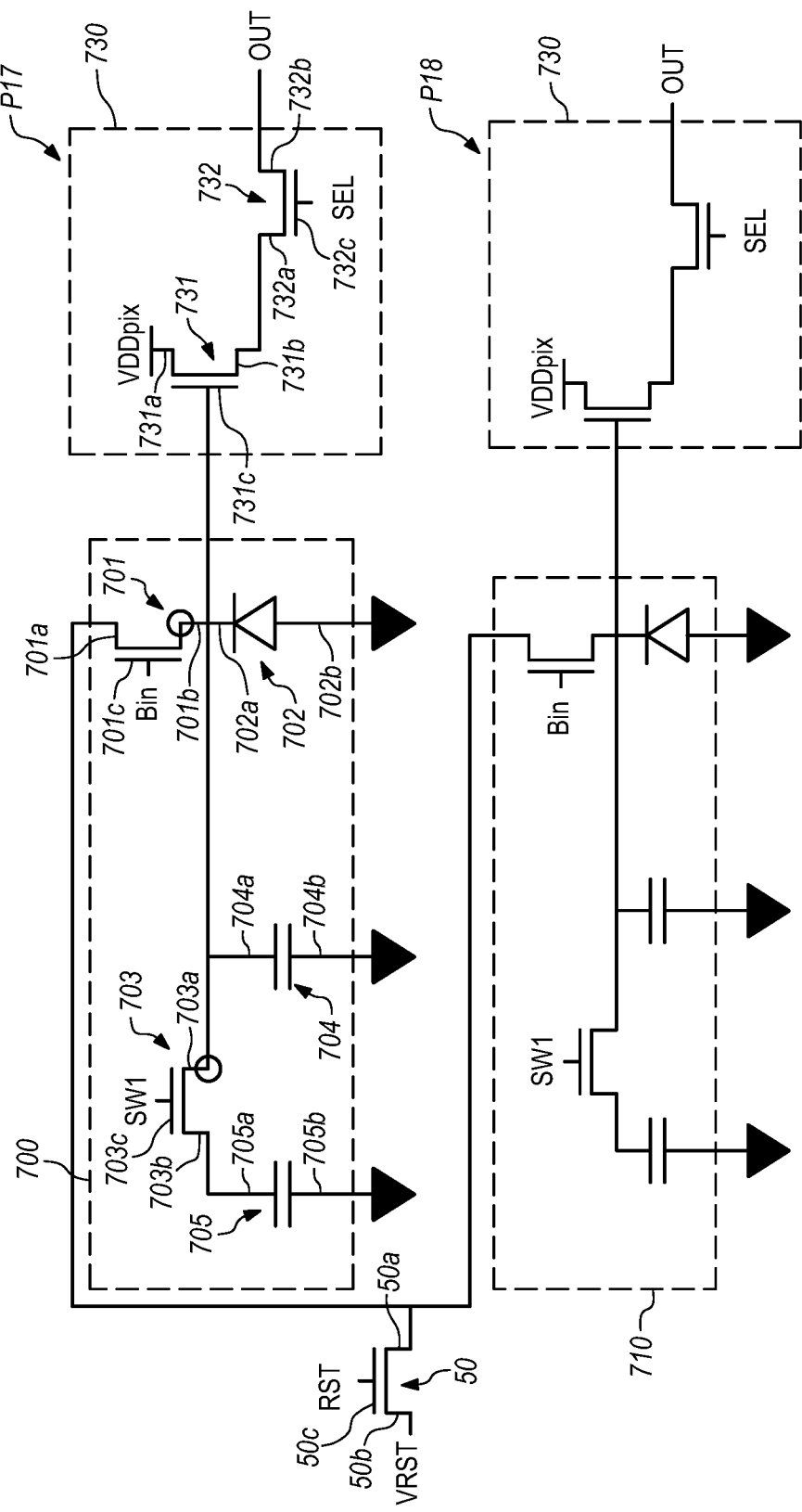
FIG. 17 schematically illustrates a binning pixel according to an example.

In an example, the capacitance, and hence, the gain and noise of the first sample R0 may also be adjusted by adding an extra capacitor 705 as shown in FIG. 17. FIG. 17 illustrates a pixel circuit comprising two pixels P17 and P18; and a reset transistor 50. Pixel 17 may comprise an input circuit 700 and an output circuit 730. The input circuit 700 may comprise a binning transistor 701 e.g. a reset transistor, which may comprise three terminals 701a, 701b and 701c; a diode 702 e.g. a Nwell to substrate, P to Nwell, N to P-substrate, partially pinned photodiode, etc., which may comprise two terminals 702a and 702b. The input circuit may further comprise a switch transistor 703 which may have three terminals 703a, 703b and 703c; a capacitor 704 which may comprise two terminals 704a and 704b; and a capacitor 705 which may comprise two terminals 705a and 705b. The output circuit 730 may comprise a pixel transistor 731 which may comprise three terminals 731a, 731b and 731c; and a selector transistor 732 which may comprise three terminals 732a, 732b and 732c. Terminal 702a of diode 702 may be coupled to terminal 701b of transistor 701 and to terminal 731c of transistor 731. Terminal 702b of the diode may be coupled to ground. Terminal 701c of transistor 701 may be connectable to a binning control signal. Terminal 701a of transistor 701 may be coupled to terminal 50a of transistor 50. Terminal 701b may be coupled to terminal 704a of capacitor 704 and to terminal 703a of transistor 703. Terminal 704b of capacitor 704 may be coupled to ground. Terminal 703c of transistor 703 may be connectable to a switch control signal SW1. Terminal 703b of transistor 703 may be coupled to terminal 705a of capacitor 705. Terminal 705b of capacitor 705 may be coupled to ground. Terminal 731a of transistor 731 may be connectable to voltage source VDDpix. Terminal 731b of transistor 731 may be coupled to terminal 732a of selector transistor 732. Terminal 732c of selector transistor 732 may be connectable to a selection control signal. Terminal 732b of selector transistor 732 may be connectable to an output device. Pixel 18 may comprise an input circuit 710 and an output circuit 730. The output OUT of pixel P18 may be connected to the output OUT of pixel P17.

Terminal 50c of transistor 50 may be connectable to a reset control signal. Terminal 50b of transistor 50 may be connectable to a voltage source VRST. Terminal 50a of transistor 50 may be coupled to input terminal of input circuit 710.

Figure 18:
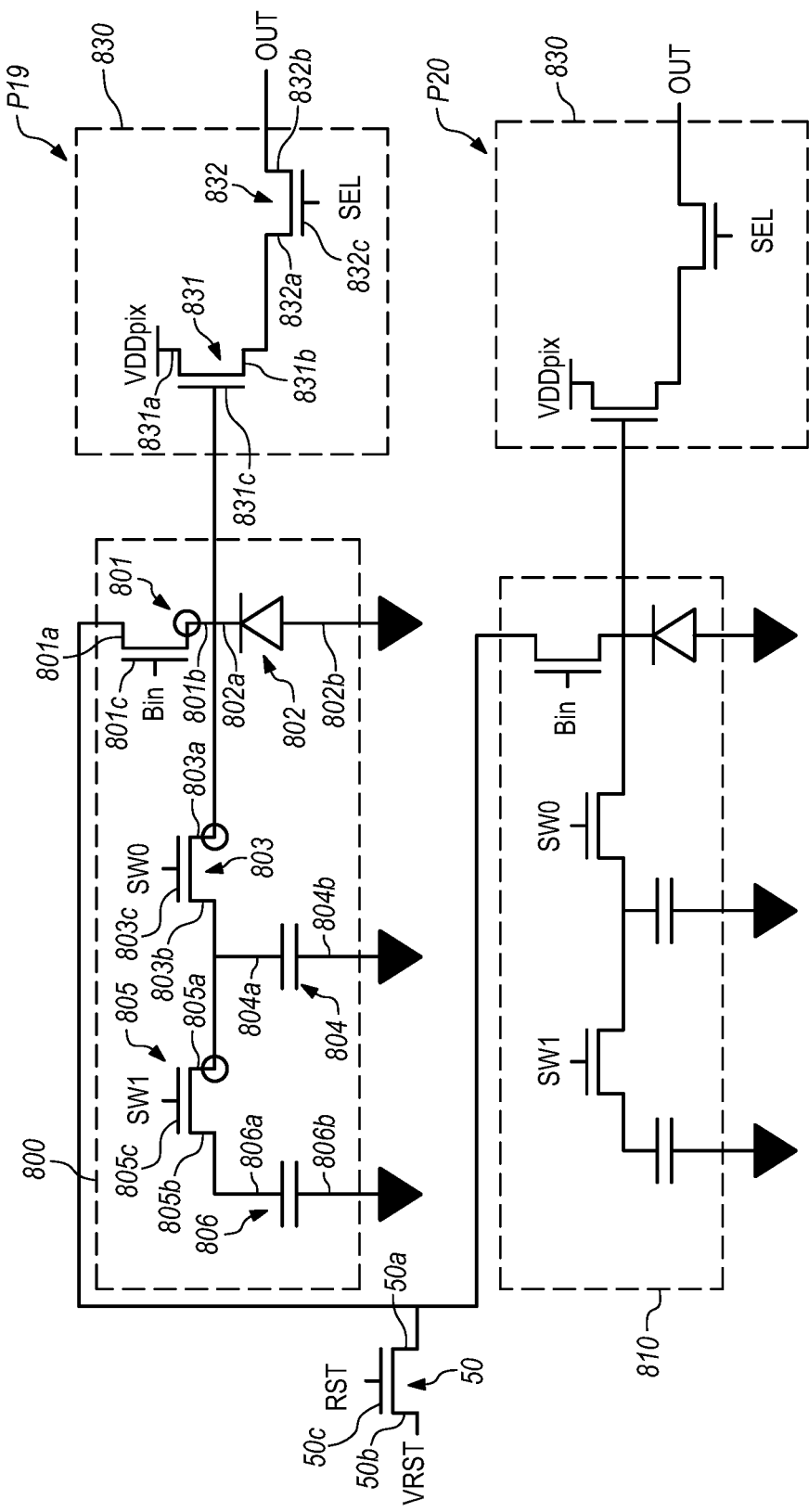
FIG. 18 schematically illustrates a binning pixel according to an example.

FIG. 18 illustrates a pixel circuit comprising two pixels P19 and P20; and a reset transistor 50. Pixel P19 may comprise an input circuit 800 and an output circuit 830. The input circuit 800 may comprise a binning transistor 801 e.g. a reset transistor, which may comprise three terminals 801a, 801b and 801c; a diode 802 e.g. a Nwell to substrate, P to Nwell, N to P-substrate, partially pinned photodiode, etc., which may comprise two terminals 802a and 802b. The input circuit may further comprise a switch transistor 803 which may have three terminals 803a, 803b and 803c; a switch transistor 805 which may have three terminals 805a, 805b and 805c; a capacitor 804 which may comprise two terminals 804a and 804b and a capacitor 806 which may comprise two terminals 806a and 806b. The output circuit 830 may comprise a pixel transistor 831 which may comprise three terminals 831a, 831b and 831c; and a selector transistor 832 which may comprise three terminals 832a, 832b and 832c. Terminal 802a of diode 802 may be coupled to terminal 801b of transistor 801 and to terminal 831c of transistor 831. Terminal 802b of the diode may be coupled to ground. Terminal 801c of transistor 801 may be connectable to a binning control signal. Terminal 801a of transistor 801 may be coupled to terminal 50a of transistor 50. Terminal 801b of transistor 801 may be coupled to terminal 803a of transistor 803. Terminal 803c of transistor 803 may be connectable to a switch control signal SW0. Terminal 803b of transistor 803 may be coupled to terminal 804a of capacitor 804 and to terminal 805a of transistor 805. Terminal 804b of capacitor 804 may be coupled to ground. Terminal 805c of transistor 805 may be connectable to a switch control signal SW1. Terminal 805b of transistor 805 may be coupled to terminal 806a of capacitor 806. Terminal 804b of capacitor 804 may be coupled to ground. Terminal 831a of transistor 831 may be connectable to voltage source VDDpix. Terminal 831b of transistor 831 may be coupled to terminal 832a of selector transistor 832. Terminal 832c of selector transistor 832 may be connectable to a selection control signal. Terminal 832b of selector transistor 832 may be connectable to an output device. Pixel P20 may comprise an input circuit 810 and an output circuit 830. Terminal 50c of transistor 50 may be connectable to a reset control signal. Terminal 50b of transistor 50 may be connectable to a voltage source VRST. Terminal 50a of transistor 50 may be coupled to input terminal of input circuit 810. The output OUT of pixel P20 may be connected to the output OUT of pixel P19.

Each pixel depicted in FIG. 18 comprises an extra switch transistor 803 and an extra capacitor 804 as compared to the example of FIG. 17. As a consequence, further functionalities may be obtained. The switch transistor 805 and the capacitor 806 may form an overflow structure, which may have the functionality and mode of the switch transistor 603 and capacitor 604 in FIG. 14.

Additionally, the switch transistor 803 and the capacitor 804 of FIG. 18 allows an extra gain selection for the first reading R0. Compared with the example of FIG. 17, capacitor 803 is added in parallel to diode. This configuration is used to adjust the input capacitance to get the optimum noise and full well. However, in this way the input capacitance is fixed and higher than the intrinsic capacitance of diode. This pixel circuit can be used to adjust the specifications of the first reading in terms of noise and full well.

By adding the extra switch transistor signal SW0, an additional flexibility may be added to the pixel circuit. In operation, when using the switch transistor 803, connecting capacitor 804 and diode 802, and thus, achieving the same type of adjustment of the input capacitance as described above. In cases where an extra gain is needed, the switch transistor SW0 may be turned off, thus exploiting the low capacitance of diode with a very high gain.

Such extra high gain may be used e.g. for triggering purposes in an X-ray application. When the pixel circuit is used for imaging, a predetermined gain and full well need to be implemented. However, when using for triggering, the pixel circuit may be required to respond as quickly as possible to the arrival of an X-ray beam. In such cases a very high gain may be desirable.

Figure 19:
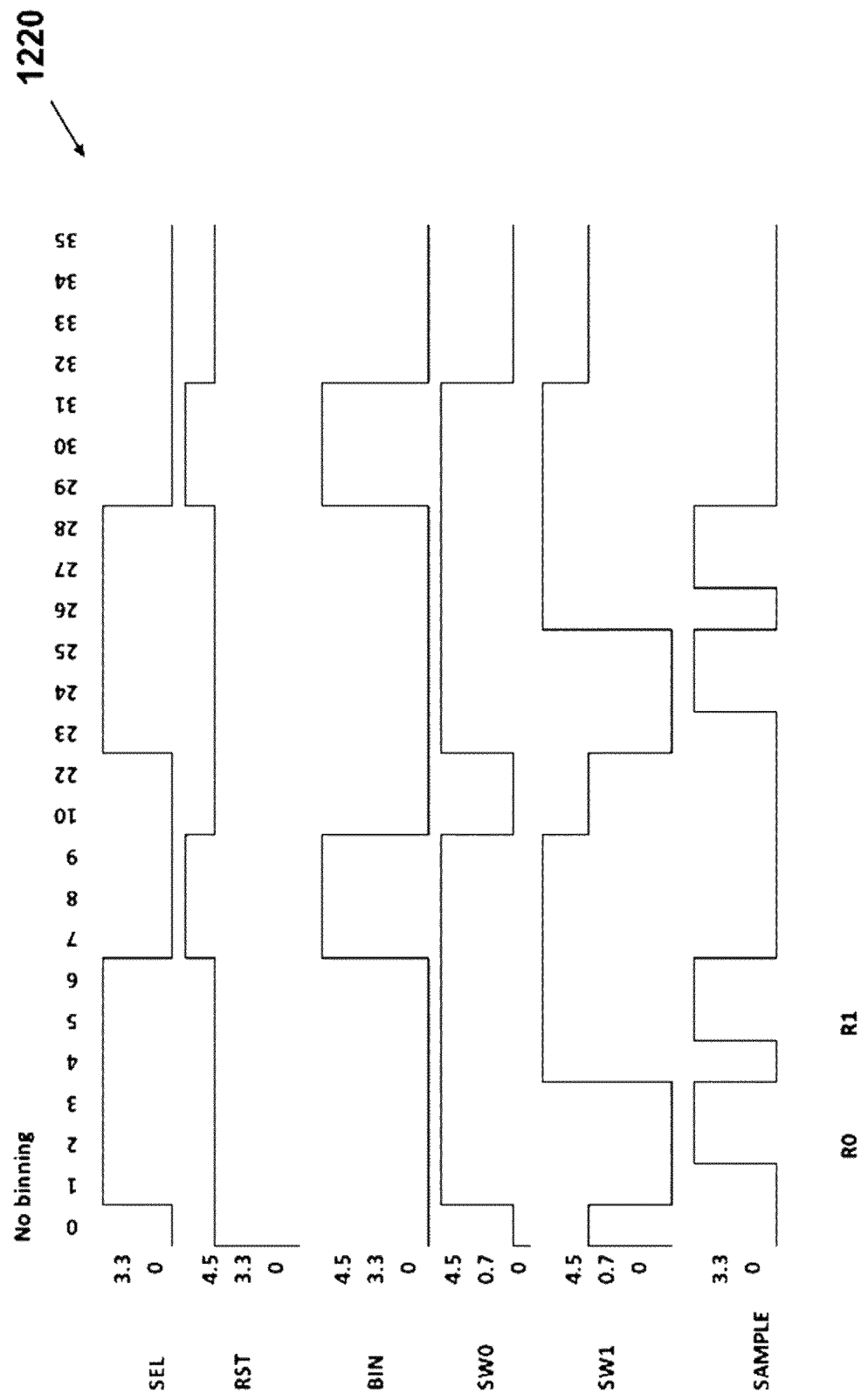
FIG. 19 illustrates a timing diagram for the binning pixel of FIG. 18 in normal operation.
Figure 20:
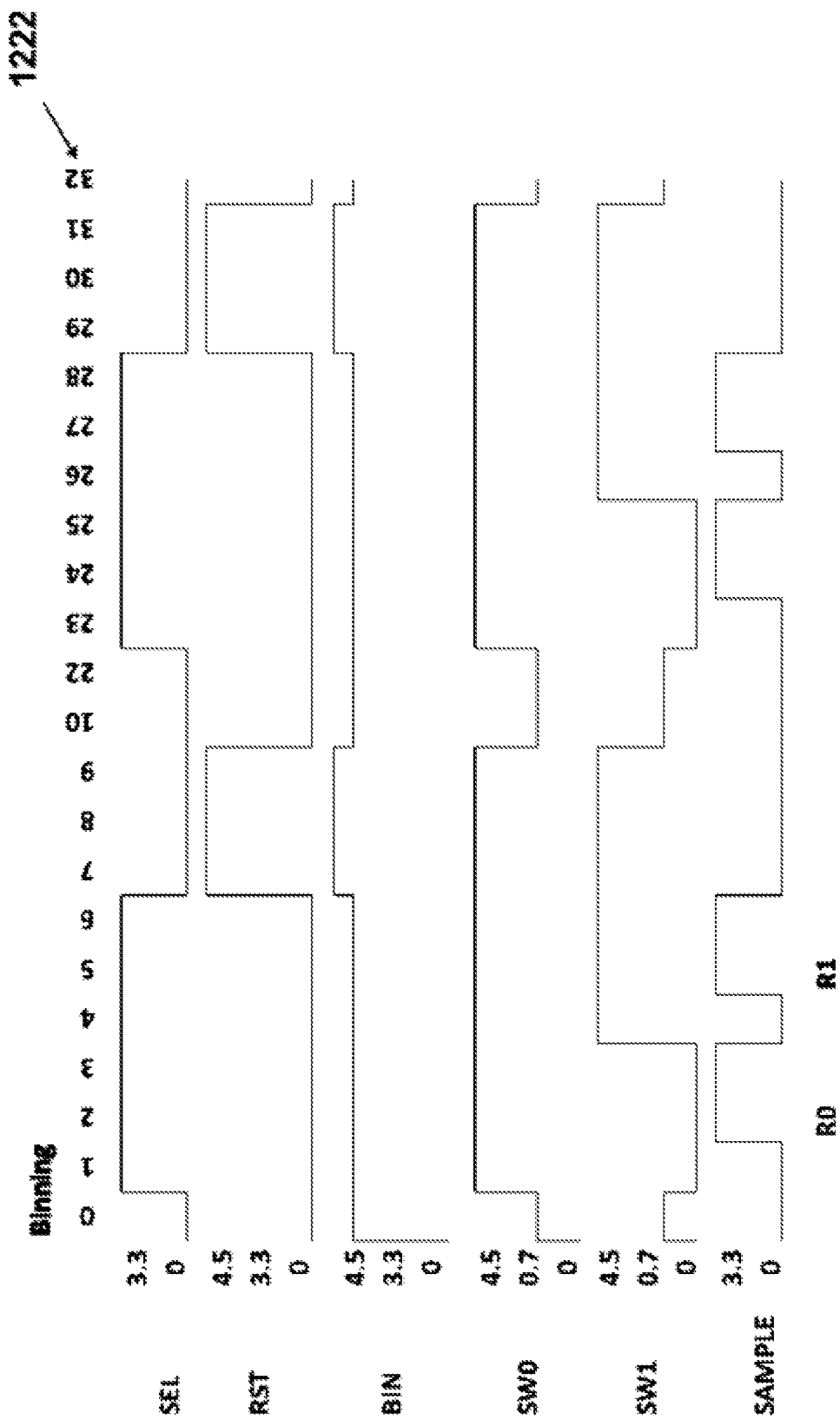
FIG. 20 illustrates a timing diagram in bin mode for the binning pixel of FIG. 18 in binning mode.
Figure 21:
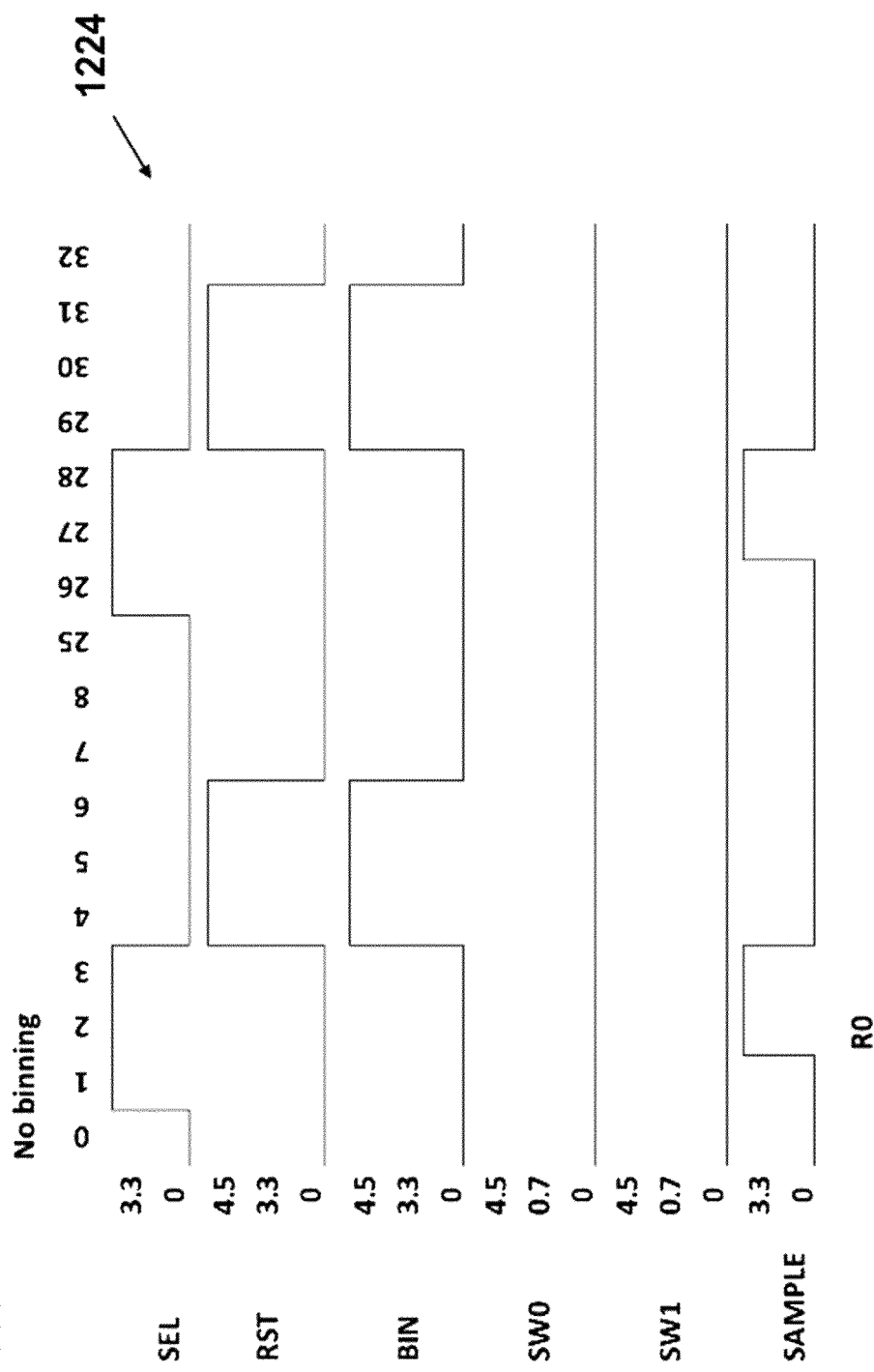
FIG. 21 illustrates a timing diagram for the binning pixel of FIG. 18 in triggering mode.

FIG. 19 illustrates an example timing diagram 1220 for the binning pixel circuit of FIG. 18 in normal operation, i.e. when it is capturing an image;

FIG. 20 illustrates an example timing diagram 1222 in bin mode for the binning pixel circuit of FIG. 18;

FIG. 21 illustrates an example timing diagram 1224 for the binning pixel circuit of FIG. 18, in triggering mode. In FIG. 19 SW0 and SW1 have a complex pattern while in FIG. 21 they are held low all the time. This is because in triggering mode no HDR operation is needed, thus the highest gain is required.

The high gain means also low noise, which is good for sensitivity. The full well would be low, but this is not important for triggering purposes. The pixel circuit of the example of FIG. 18 may therefore be used for both triggering and imaging without any loss of performance in contrast to prior art (see Korthout et Al., EP-442, US-642). As a result, any pixel in the image area may be selected for triggering. The sensor control may work in a row-wise way. In an example, all pixels in one row may be selected for trigger. In an example, an additional transistor may be added in order to achieve a fully addressable XY trigger pixel selection. Even if it only controlled at row level (see FIG. 23) the ability of using the same pixels for triggering as for imaging allows the choice of the triggering pixels, as well as the time it takes to read the trigger area, to be flexible then adapted to the application.

Figure 22:
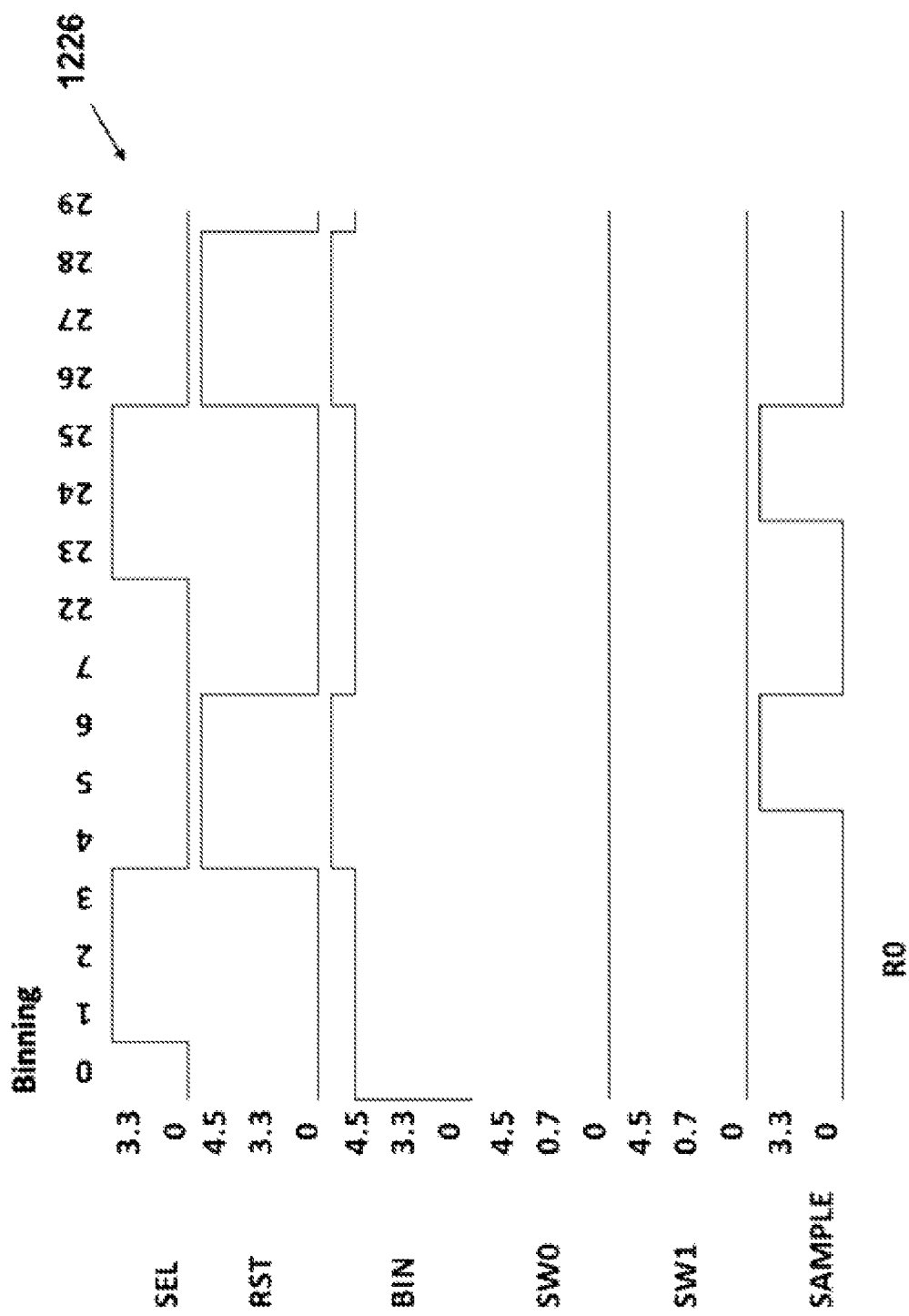
FIG. 22 illustrates a timing diagram in triggering mode for the binning pixel of FIG. 18 in binning mode.

FIG. 22 shows a timing diagram 1226 in bin/triggering mode for the embodiment of FIG. 18.

Figure 23:
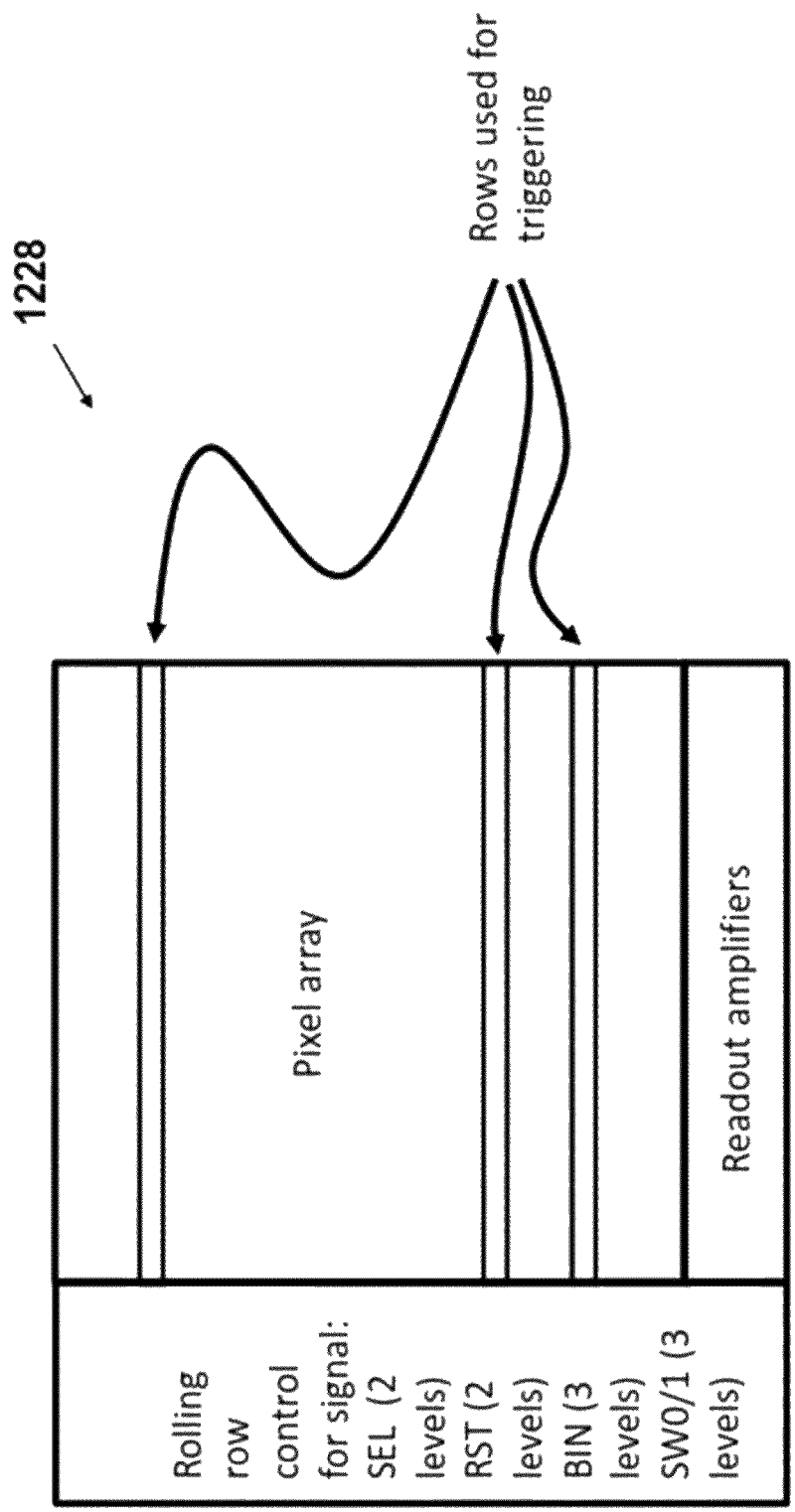
FIG. 23 illustrates a selection of trigger rows according to an example.

FIG. 23 schematically illustrates random selection 1228 of trigger rows as enabled by examples disclosed herein.

Figure 24:
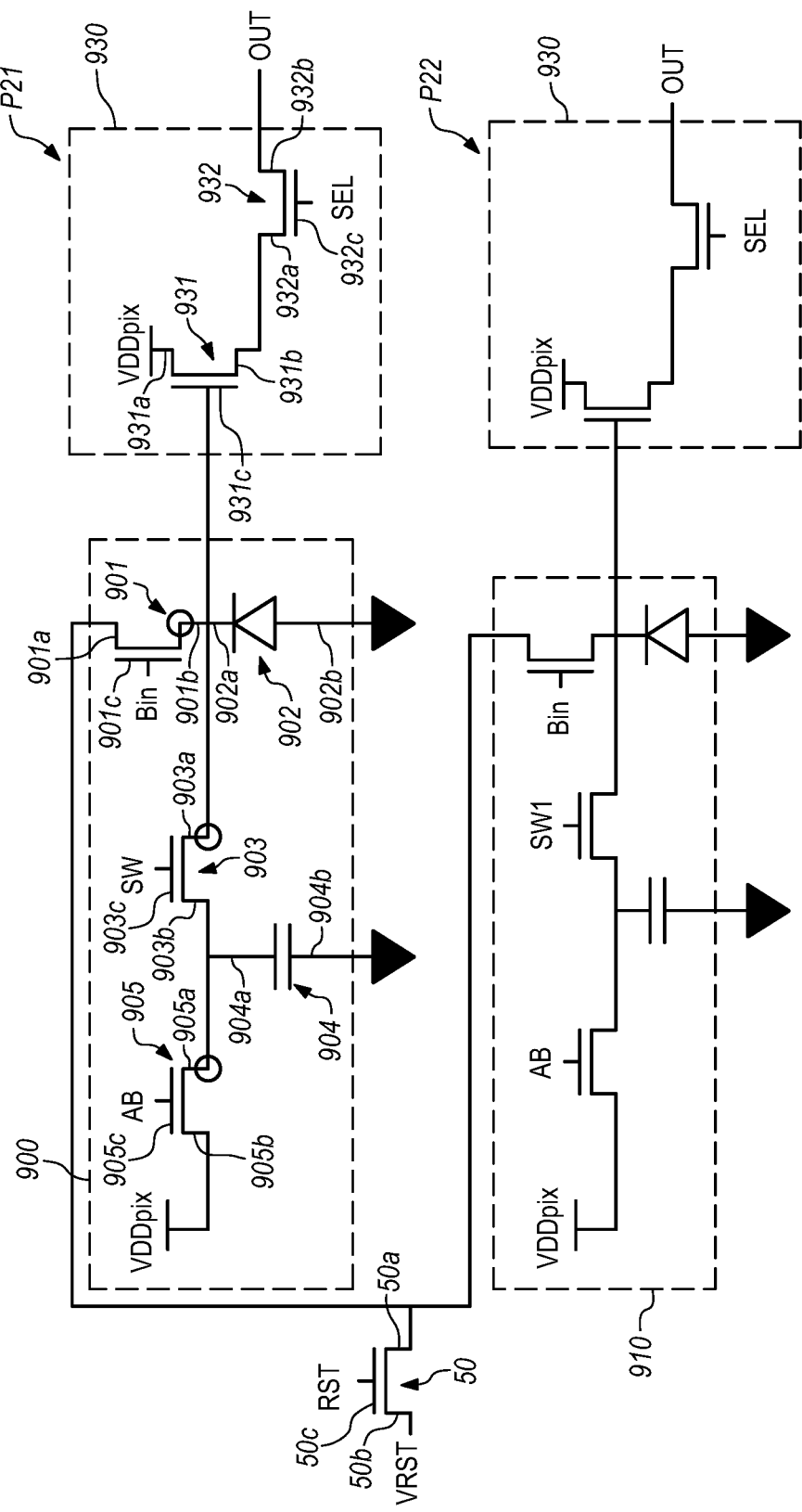
FIG. 24 schematically illustrates a binning pixel according to an example.

FIG. 24 shows a pixel circuit comprising two pixels P21 and P22; and a reset transistor 50. Pixel P21 may comprise an input circuit 900 and an output circuit 930. The input circuit 900 may comprise a binning transistor 901 e.g. a reset transistor, which may comprise three terminals 901a, 901b and 901c; a diode 902 e.g. a Nwell to substrate, P to Nwell, N to P-substrate, partially pinned photodiode, etc., which may comprise two terminals 902a and 902b. The input circuit may further comprise a switch transistor 903 which may have three terminals 903a, 903b and 903c; a capacitor 904 which may comprise two terminals 904a and 904b; and an anti-blooming (AB) transistor 905 which may have three terminals 905a, 905b and 905c. The output circuit 930 may comprise a pixel transistor 931 which may comprise three terminals 931a, 931b and 931c; and a selector transistor 932 which may comprise three terminals 932a, 932b and 932c. Terminal 902a of diode 902 may be coupled to terminal 901b of transistor 901 and to terminal 931c of transistor 931. Terminal 902b of the diode may be coupled to ground. Terminal 901c of transistor 901 may be connectable to a binning control signal. Terminal 901a of transistor 901 may be coupled to terminal 50a of transistor 50. Terminal 901b may be coupled to terminal 903a of transistor 903. Terminal 903c of transistor 903 may be connectable to a switch control signal SW. Terminal 903b of transistor 903 may be coupled to terminal 904a of capacitor 904 and to terminal 905a of AB transistor 905. Terminal 604b of capacitor 904 may be coupled to ground. Terminal 905c of transistor 905 may be connectable to an anti-blooming control signal AB. Terminal 905b of transistor 905 may be connectable to a voltage source VDDpix. Terminal 931a of transistor 931 may be connectable to voltage source VDDpix. Terminal 931*b* of transistor 931 may be coupled to terminal 932*a* of selector transistor 932. Terminal 932*c* of selector transistor 932 may be connectable to a selection control signal. Terminal 932*b* of selector transistor 932 may be connectable to an output device. Pixel P22 may comprise an input circuit 910 and an output circuit 930. Terminal 50*c* of transistor 50 may be connectable to a reset control signal. Terminal 50*b* of transistor 50 may be connectable to a voltage source VDDpix. Terminal 50*a* of transistor 50 may be coupled to input terminal of input circuit 910. The output OUT of pixel P22 may be connected to the output OUT of pixel P21.

The pixel circuit depicted in FIG. 24 is similar to the example of FIG. 14 but further comprising an AB transistor 905 which may be used for anti-blooming purposes. The AB transistor 905 may be biased at an intermediate voltage, e.g. 0.7V, thus limiting the overall full well and avoiding blooming of the pixel circuit. During reset, AB transistor 905 may also be used to help resetting the pixel circuit. In FIG. 24, AB transistor 905 is connected on one side to VDDpix, VDD power supply for the pixel circuit. In an example, AB transistor 905 may also be connected to VRST or to a different DC voltage.

Figure 25:
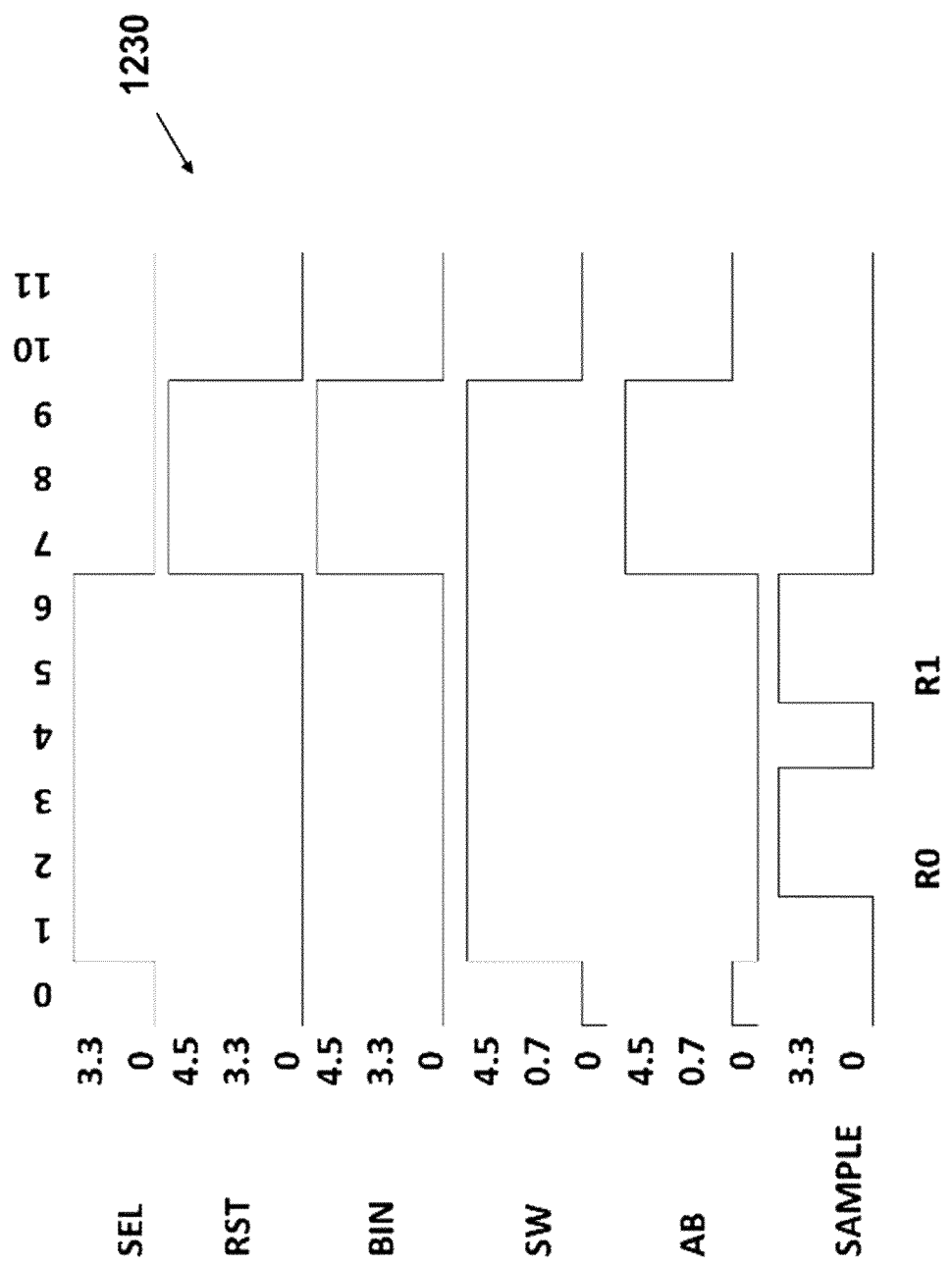
FIG. 25 illustrates a timing diagram in no binning mode for the binning pixel of FIG. 24.

FIG. 25 shows a timing diagram 1230 for the example of FIG. 24 in no bin mode.

Figure 26:
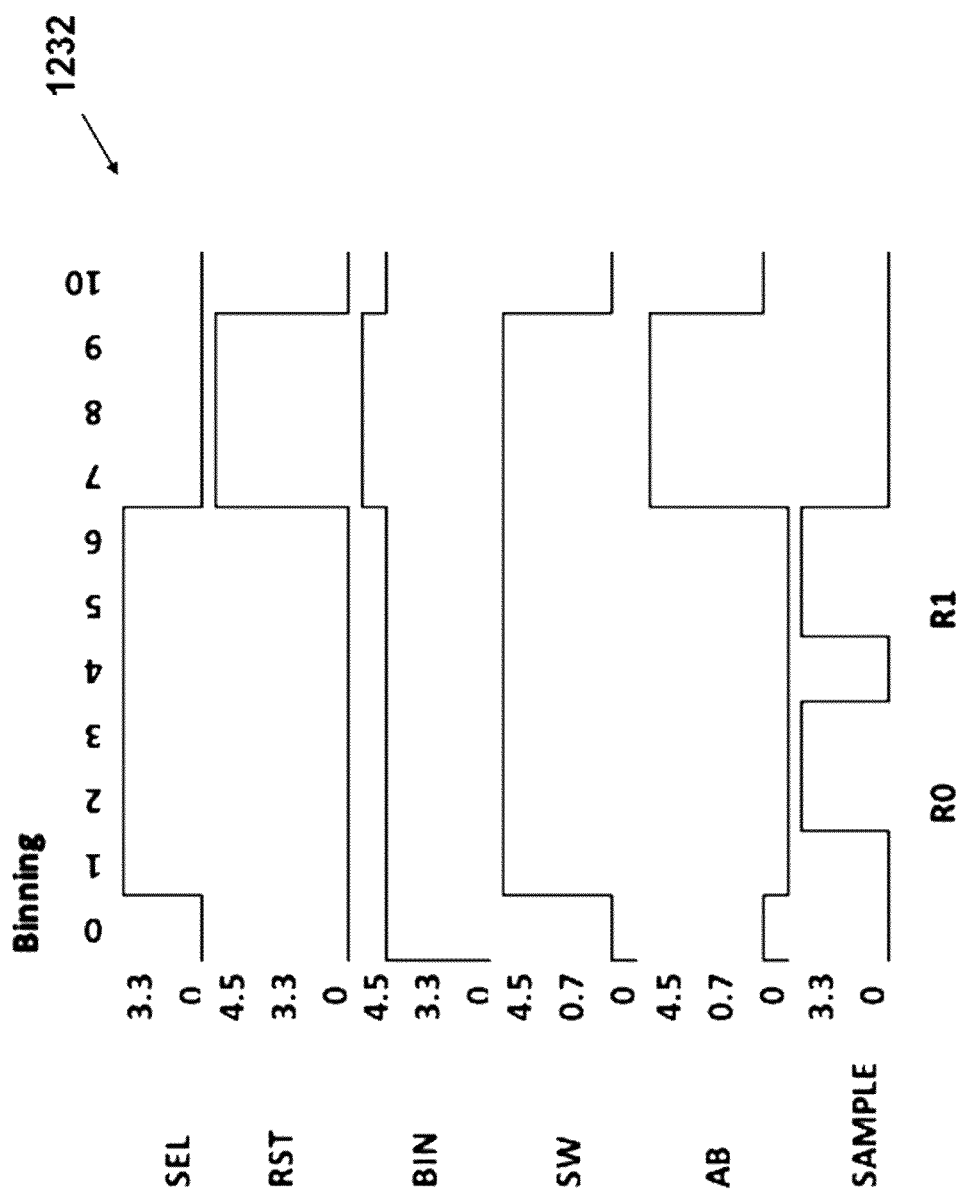
FIG. 26 illustrates a timing diagram in binning mode for the binning pixel of FIG. 24.

FIG. 26 shows a timing diagram 1232 for the example of FIG. 24 in bin mode.

Figure 27:
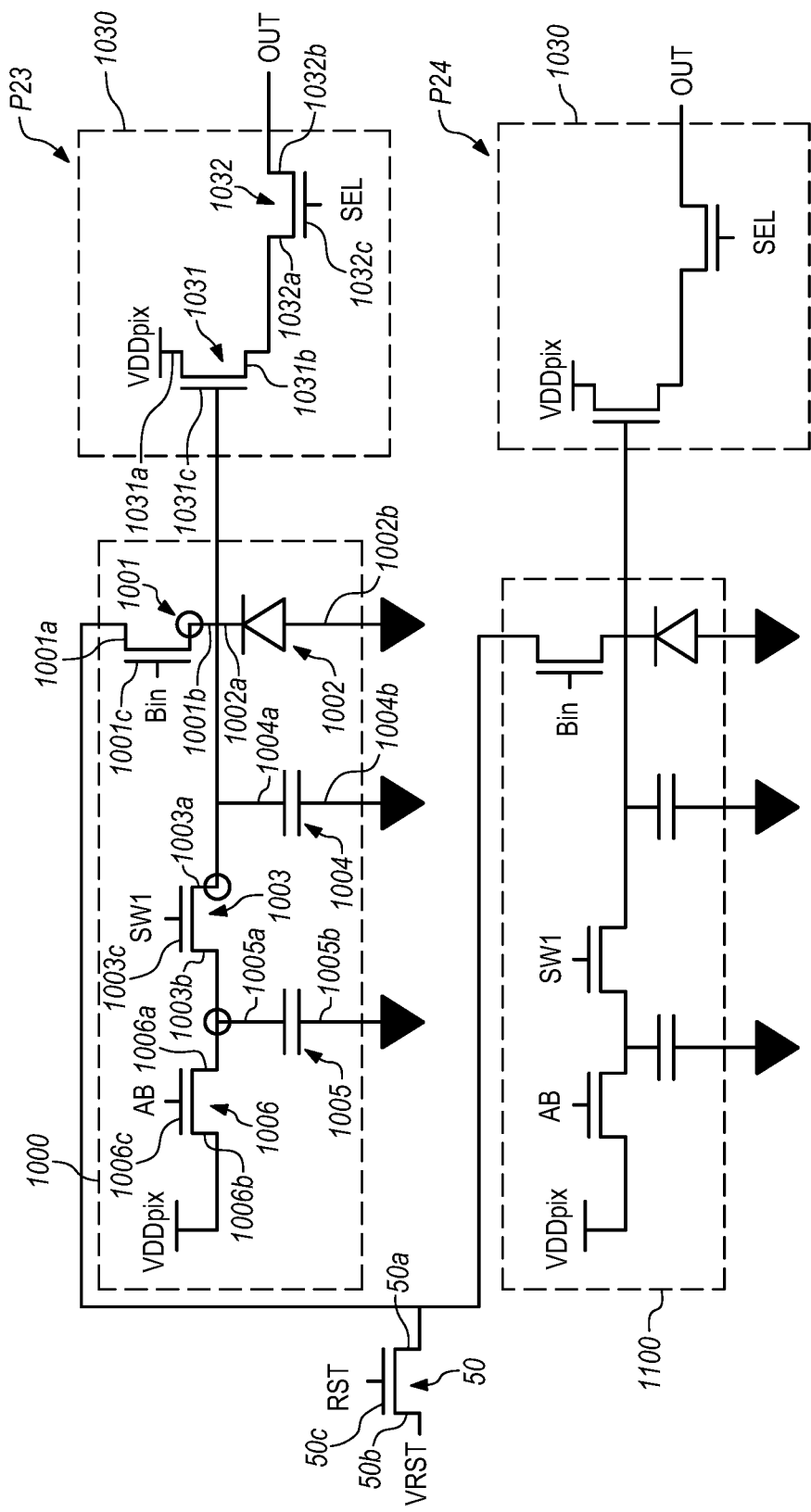
FIG. 27 schematically illustrates a binning pixel according to an example.

FIG. 27 depicts a pixel circuit comprising two pixels P23 and P24; and a reset transistor 50. Pixel P23 may comprise an input circuit 1000 and an output circuit 1030. The input circuit 1000 may comprise a binning transistor 1001 e.g. a reset transistor, which may comprise three terminals 1001*a*, 1001*b* and 1001*c*; a diode 1002 e.g. a Nwell to substrate, P to Nwell, N to P-substrate, partially pinned photodiode, etc., which may comprise two terminals 1002*a* and 1002*b*. The input circuit may further comprise a switch transistor 1003 which may have three terminals 1003*a*, 1003*b* and 1003*c*; an AB transistor 1006 which may have three terminals 1006*a*, 1006*b* and 1006*c*; a capacitor 1004 which may comprise two terminals 1004*a* and 1004*b*; and a capacitor 1005 which may comprise two terminals 1005*a* and 1005*b*. The output circuit 1030 may comprise a pixel transistor 1031 which may comprise three terminals 1031*a*, 1031*b* and 1031*c*; and a selector transistor 1032 which may comprise three terminals 1032*a*, 1032*b* and 1032*c*. Terminal 1002*a* of diode 1002 may be coupled to terminal 1001*b* of transistor 1001 and to terminal 1031*c* of transistor 1031. Terminal 1002*b* of the diode may be coupled to ground. Terminal 1001*c* of transistor 1001 may be connectable to a binning control signal. Terminal 1001*a* of transistor 1001 may be coupled to terminal 50*a* of transistor 50. Terminal 1001*b* may be coupled to terminal 1004*a* of capacitor 1004 and to terminal 1003*a* of transistor 1003. Terminal 1004*b* of capacitor 1004 may be coupled to ground. Terminal 1003*c* of transistor 1003 may be connectable to a switch control signal SW1. Terminal 1003*b* of transistor 1003 may be coupled to terminal 1005*a* of capacitor 1005 and to terminal 1006*a* of AB transistor 1006. Terminal 1005*b* of capacitor 1005 may be coupled to ground. Terminal 1006*b* of AB transistor 1006 may be coupled to a voltage source VDDpix. Terminal 1031*a* of transistor 1031 may be connectable to voltage source VDDpix. Terminal 1031*b* of transistor 1031 may be coupled to terminal 1032*a* of selector transistor 1032. Terminal 1032*c* of selector transistor 1032 may be connectable to a selection control signal. Terminal 1032*b* of selector transistor 1032 may be connectable to an output device. Pixel 24 may comprise an input circuit 1100 and an output circuit 1030. Terminal 50*c* of transistor 50 may be connectable to a reset control signal. Terminal 50*b* of transistor 50 may be connectable to a voltage source VRST. Terminal 50*a* of transistor 50 may be coupled to input terminal of input circuit 1100. The output OUT of pixel P24 may be connected to the output OUT of pixel P23.

FIG. 27 depicts an example of a pixel circuit similar to the pixel circuit shown in FIG. 18, further comprising an AB transistor similar to the one of FIG. 24. The timing diagram (not shown) would be easily derivable from the timing diagrams of examples as disclosed herein. Alternatively, the AB transistor may be held static at an intermediate voltage e.g. similar to the intermediate voltage used for the SW1 switch. Therefore, any excess charge on capacitor 1005 would be drained off by AB.

When operating the pixel circuit with overflow as described in the example of FIGS. 18 and 27, every pixel may generate two readings. In an example, both readings may be kept/selected, but (even when both readings are not saturated) one of the readings would have better characteristics than the other, i.e. better noise. In another example, only one reading may be kept. In another example, the first non-saturated reading may be kept as it would have the best noise performance.

In an example, some circuitry may be added at the periphery of the sensor in order to select (keep) only the first non-saturated reading and to generate a gain bit which memorizes which reading was kept.

Figure 28:
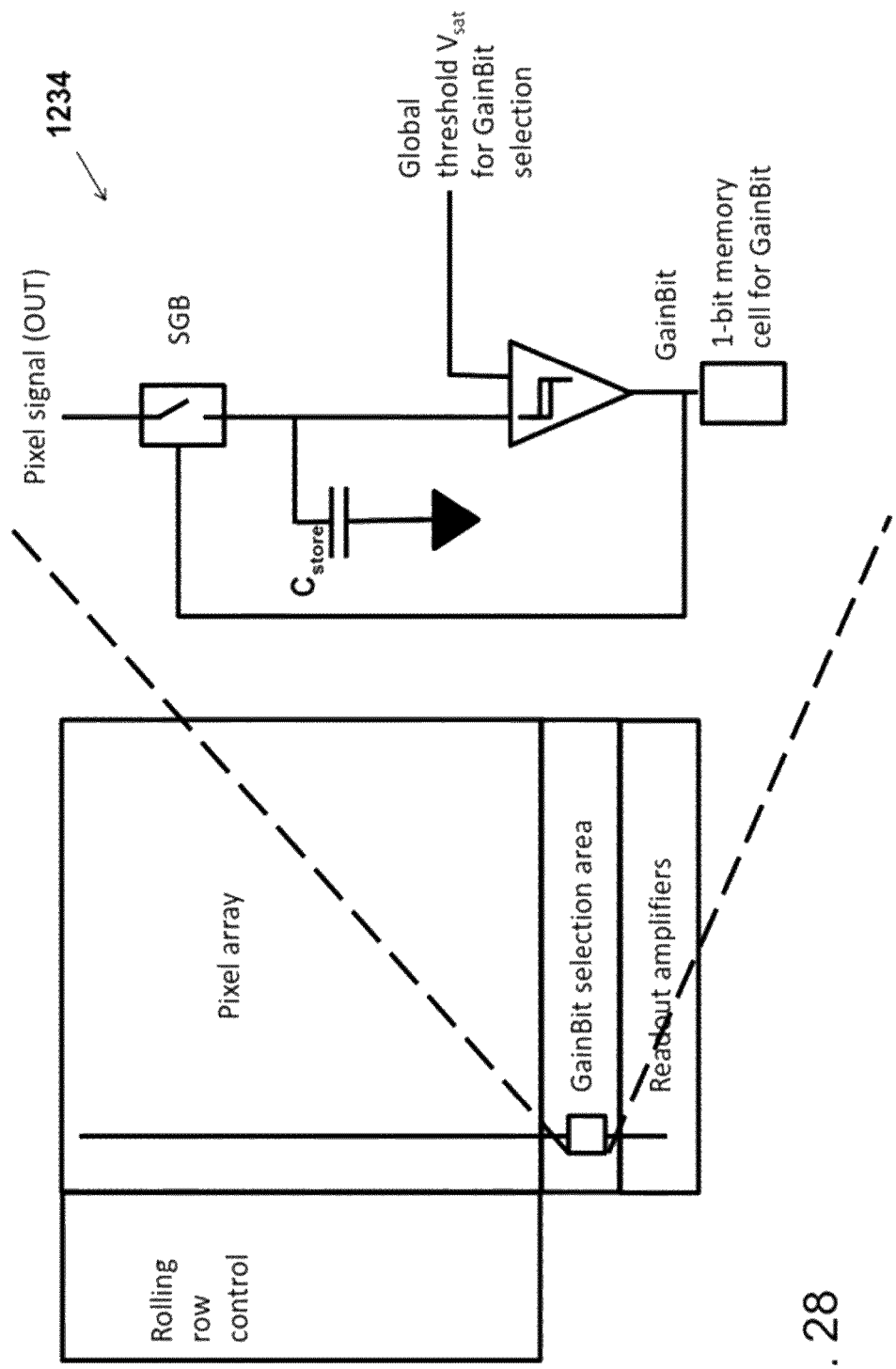
FIG. 28 schematically illustrates gain bit circuit according to an example.

In the example of FIG. 28, a schematic example of a gain bit generator circuit 1234 is shown. The output OUT of each pixel may be read twice. In the first reading R0, the switch may be left open. Then the pixel may operate with high gain, low noise and low full well. Initially the gain bit may be 1, then the Switch Gain Bit (SGB) may be closed and the output sampled and stored on the capacitor Cstore. The stored voltage may be compared to a user selectable threshold Vsat. In an example where saturation is not detected, then GainBit may flip to 0, thus opening SGB. Any further read, e.g. second read R1, may not be passed through SGB. The value on Cstore may be the value from the first reading R0 and gain bit GB may be equal to 0. In an example where saturation is detected, GainBit may remain equal to 1. This value is stored in the GainBit cell. The switch SGB is kept closed. The subsequent reading R1 is then passed through and stored in the capacitor Cstore. Notice that in the second read GainBit is not sampled or modified.

The pixel circuits of the examples of FIG. 18 and FIG. 27, may also be used to achieve monitoring, e.g. of the X-ray beam. In such case, the purpose is to start from a situation of illumination and try to establish when the beam is turned off. In an example, as the starting point is highly illuminated, only the second reading R1 may be considered, i.e. the reading having the lower gain and higher full well and the first reading may be discarded. In such a case, the circuit may be operated to read each pixel as in any of the examples disclosed, but in addition it may force the gain bit circuitry to keep only the second reading R1 and to transmit such reading outside of the sensor.

Any of the disclosed examples may also be implemented with transistors designed with radiation hard rules, e.g. with enclosed geometry, to make the sensor radiation resistant and preventing it from degrading under irradiation. Such implementation may for example be used in X-ray imaging, as being exposed to high energy radiation would cause the sensor to be damaged, i.e. affecting the lifetime of the sensor.

Although only a number of examples have been disclosed herein, other alternatives, modifications, uses and/or equivalents thereof are possible. Furthermore, all possible combinations of the described examples are also covered. Thus, the scope of the present disclosure should not be limited by particular examples, but should be determined only by a fair reading of the claims that follow. If reference signs related to drawings are placed in parentheses in a claim, they are solely for attempting to increase the intelligibility of the claim, and shall not be construed as limiting the scope of the claim.

The invention claimed is:

1. A low leakage binned pixel, comprising:
   a photodiode, having an anode and a cathode;
   a bin transistor, having
      a first terminal coupled to the cathode of the photodiode,
      a second terminal, configured to be coupled to a first terminal of a voltage reset switch (VRST) transistor;
      a gate, configured to be coupled to a controller to receive a bin signal; and
   an output amplifier circuit, having an input and an output, wherein the input is coupled to the cathode of the photodiode and to the second terminal of the bin transistor.

2. The low leakage binned pixel according to claim 1, further comprising a lateral overflow circuit, coupled at one terminal to the cathode of the photodiode and to the first terminal of the bin transistor and to the other terminal to ground.

3. The low leakage binned pixel according to claim 2, wherein the lateral overflow circuit comprises a first switch transistor and a first capacitor connected in series, the first switch transistor having
   a first terminal connected to the cathode of the photodiode and to the first terminal of the bin transistor,
   a second terminal connected to a first terminal of the first capacitor, wherein a second terminal of the first capacitor is connected to ground, and
   a gate configured to be coupled to the controller to receive a first switch signal.

4. The low leakage binned pixel according to claim 3, further comprising a second capacitor, having a first terminal connected to the first terminal of the first switch transistor and another terminal to ground.

5. The low leakage binned pixel according to claim 3, wherein the lateral overflow circuit further comprises an antiblooming transistor, having
   a first terminal coupled to a first voltage source;
   a second terminal coupled to the first terminal of the first capacitor; and
   a gate configured to be coupled to the controller to receive an antiblooming signal.

6. The low leakage binned pixel according to claim 2, comprising a first switch transistor, a first capacitor, a second switch transistor and a second capacitor, wherein
   the first capacitor is coupled at a first terminal to a first terminal of the first switch and at a second terminal to ground;
   the first switch transistor is coupled at a second terminal to the first terminal of the second capacitor;
   the second capacitor is coupled at a second terminal to ground;
   the second switch transistor is coupled at a first terminal to the cathode of the photodiode and to the first terminal of the bin transistor, and at a second terminal to the first terminal of the second capacitor,
   wherein a gate of the first and second switch transistors, respectively, is configured to be coupled to the controller to receive a first and a second switch signals, respectively.

7. A low leakage binned pixel according to claim 1, wherein the output amplifier circuit comprises
   an input transistor having a first terminal coupled to a drain constant voltage source, a gate coupled to the cathode of the photodiode and to the first terminal of the bin transistor; and
   a selector transistor having a first terminal coupled to a second terminal of the pixel transistor, a gate configured to be coupled to the controller, and wherein a second terminal of the selector transistor is the output of the low leakage binned pixel.

8. A low leakage binned pixel according to claim 1, wherein the photodiode is a partially pinned photodiode.

9. A multi-pixel binned circuit, comprising:
   a plurality of low leakage pixels according to claim 1;
   an RST transistor, having
      a first terminal coupled to the second terminal of each bin transistor from the plurality of low leakage binned pixels;
      a second terminal coupled to a reset voltage source;
      a gate configured to be coupled to the controller to receive a voltage reset signal.

10. The multi-pixel binned circuit according to claim 9, wherein the circuit is a two or four-pixel binned circuit.

11. An image sensor comprising a plurality of multi-pixel binned circuits, according to claim 9.

12. The image sensor according to claim 11, wherein the plurality of multi-pixel binned circuits is disposed in an array of rows and columns.

13. The image sensor according to claim 12, wherein the controller outputs the bin signal.

14. The image sensor according to claim 13, further comprising a gain bit circuit coupled at the output of the output amplifier circuit of the low leakage binned pixels.

15. The image sensor according to claim 13, wherein the controller is configured to generate the bin signal and one or more of the voltage reset signal, a select signal, an antiblooming signal, a first switch signal and a second switch signal.

16. A camera comprising an image sensor according to claim 11.

17. A low leakage binned pixel according to claim 1, wherein the anode of the photodiode is configured to collect electrons, generated by light or other form of ionising radiation.

18. A multi-pixel binned circuit, comprising:
   a plurality of low leakage pixels, each of the low leakage pixels comprising:
      a photodiode, having an anode and a cathode, the anode to collect electrons,
      generated by light or by other form of ionising radiation;
      a bin transistor, having
         a first terminal coupled to the cathode of the photodiode;
         a second terminal, configured to be coupled to a first terminal of a voltage reset switch (VRST) transistor;
         a gate, configured to be coupled to a controller to receive a bin signal; and an output amplifier circuit, having an input and an output, wherein the input is coupled to the cathode of the photodiode and to the second terminal of the bin transistor, the multi-pixel binned circuit further comprising an RST transistor, having
- a first terminal coupled to the second terminal of each of one or more bin switches from the plurality of low leakage binned pixels;
- a second terminal coupled to a reset voltage source; and
- a gate configured to be coupled to a controller to receive a voltage reset signal.

19. The multi-pixel binned circuit according to claim 18, wherein the circuit is a two or four-pixel binned circuit.

20. An image sensor comprising a plurality of multi-pixel binned circuits, each of the plurality of multi-pixel binned circuits comprising:
- a plurality of low leakage pixels, each of the low leakage pixels comprising:
  - a photodiode, having an anode and a cathode, the anode to collect electrons, generated by light or by other form of ionising radiation;
  - a bin transistor, having
    - a first terminal coupled to the cathode of the photodiode,
    - a second terminal, configured to be coupled to a first terminal of a voltage reset switch (VRST) transistor;
    - a gate, configured to be coupled to a controller to receive a bin signal; and
  - an output amplifier circuit, having an input and an output, wherein the input is coupled to the cathode of the photodiode and to the second terminal of the bin transistor,
- a RST transistor, having
  - a first terminal coupled to the second terminal of each of one or more bin switches from the plurality of low leakage binned pixels;
  - a second terminal coupled to a reset voltage source; and
  - a gate configured to be coupled to a controller to receive a voltage reset signal.

\* \* \* \* \*